(12) United States Patent
Noh

(10) Patent No.: US 12,035,527 B2
(45) Date of Patent: Jul. 9, 2024

(54) SEMICONDUCTOR DEVICE AND METHOD FOR FABRICATING THE SAME

(71) Applicant: SK hynix Inc., Icheon-si (KR)

(72) Inventor: Yoo Hyun Noh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 257 days.

(21) Appl. No.: 17/374,772

(22) Filed: Jul. 13, 2021

(65) Prior Publication Data

US 2022/0246638 A1 Aug. 4, 2022

(30) Foreign Application Priority Data

Jan. 29, 2021 (KR) .................. 10-2021-0013498

(51) Int. Cl.
| | |
|---|---|
| *H10B 43/27* | (2023.01) |
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.
CPC ......... *H10B 43/27* (2023.02); *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 41/27; H10B 43/27; H10B 41/40; H10B 43/40; H01L 23/5226; H01L 23/481; H01L 21/76802; H01L 21/76804; H01L 21/76805; H01L 21/76831; H01L 21/76832; H01L 21/76808
See application file for complete search history.

(56) References Cited

U.S. PATENT DOCUMENTS

| | | | | |
|---|---|---|---|---|
| 8,821,752 | B2 * | 9/2014 | Cho | H10B 41/27 |
| | | | | 252/79.3 |
| 9,236,392 | B1 * | 1/2016 | Izumi | H10B 43/40 |
| 10,038,006 | B2 | 7/2018 | Furihata et al. | |
| 10,141,221 | B1 * | 11/2018 | Lai | H01L 21/76831 |
| 10,290,648 | B1 * | 5/2019 | Zhou | H10B 43/27 |
| 10,573,657 | B2 | 2/2020 | Baek et al. | |
| 2016/0218059 | A1 * | 7/2016 | Nakada | H10B 41/27 |
| 2019/0393238 | A1 * | 12/2019 | Lim | H10B 43/27 |
| 2021/0398847 | A1 * | 12/2021 | Parekh | H01L 21/76897 |
| 2022/0208785 | A1 * | 6/2022 | Titus | H10B 41/27 |

* cited by examiner

*Primary Examiner* — Ali Naraghi
*Assistant Examiner* — E. Rhett Cheek
(74) *Attorney, Agent, or Firm* — WILLIAM PARK & ASSOCIATES LTD.

(57) ABSTRACT

A method for fabricating a semiconductor device includes preparing a lower structure including an interconnection, forming a first contact plug coupled to the interconnection, and forming an alternating stack of dielectric layers and sacrificial layers over the first contact plug and the lower structure. The method further includes forming an opening that penetrates the alternating stack and exposes the first contact plug, forming a sacrificial plug including a void in the opening, forming a contact hole that exposes the first contact plug by etching a portion of the sacrificial plug, and forming a second contact plug in the contact hole.

16 Claims, 23 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2021-0013498, filed on Jan. 29, 2021, which is incorporated herein by reference in its entirety.

BACKGROUND

1. Field

Some embodiments of the present disclosure relate to a semiconductor device, and more particularly, to a vertical semiconductor device and a method for fabricating the vertical semiconductor device.

2. Description of the Related Art

A semiconductor device such as three-dimensional (3D) NAND memory device has a structure in which a plurality of memory cells are arranged in a direction of a vertical channel by covering the vertical channel with a memory layer.

SUMMARY

Some embodiments of the present disclosure are directed to a semiconductor device with improved reliability, and a method for fabricating the semiconductor device.

In accordance with an embodiment of the present disclosure, a method for fabricating a semiconductor device includes forming a lower structure including an interconnection; forming a first contact plug coupled to the interconnection; forming an alternating stack of dielectric layers and sacrificial layers over the first contact plug and the lower structure; forming an opening that penetrates the alternating stack and exposes the first contact plug; forming a sacrificial plug including a void in the opening; forming a contact hole that exposes the first contact plug by etching a portion of the sacrificial plug; and forming a second contact plug in the contact hole.

In accordance with another embodiment of the present disclosure, a method for fabricating a semiconductor device includes forming a source structure including a first contact plug over a lower structure including an interconnection, wherein the first contact plug is coupled to the interconnection; forming an alternating stack of dielectric layers and sacrificial layers over the first contact plug and the source structure; forming a vertical channel structure that penetrates a portion of the alternating stack; forming a void-embedded sacrificial plug that is spaced apart from the vertical channel structure, penetrates the alternating stack, and is coupled to the first contact plug; replacing a portion of the sacrificial layers with gate electrodes to surround the vertical channel structure; forming a contact hole that exposes the first contact plug by etching a portion of the void-embedded sacrificial plug; forming a pad contact hole that exposes edges of the gate electrodes; forming a contact plug in the contact hole; and forming a gate contact plug in the pad contact hole.

In accordance with yet another embodiment of the present disclosure, a method for fabricating a semiconductor device includes forming a source structure including a first contact plug over a lower structure including an interconnection, wherein the first contact plug is coupled to the interconnection; forming an alternating stack of dielectric layers and sacrificial layers over the first contact plug and the source structure; forming a vertical channel structure that penetrates the alternating stack; forming a hole-type opening that exposes the first contact plug and line-type openings that are disposed adjacent to the hole-type opening, the hole-type opening and the line-type openings being spaced apart from the vertical channel structure and penetrating the alternating stack; forming a void-embedded sacrificial plug in the hole-type opening; filling the line-type openings with void-free supporters; replacing a portion of the sacrificial layers with gate electrodes to surround the vertical channel structure; forming a contact hole that exposes the first contact plug by etching a portion of the void-embedded sacrificial plug; forming a pad contact hole that exposes edges of the gate electrodes; forming a contact plug in the contact hole; and forming a gate contact plug in the pad contact hole.

In accordance with still another embodiment of the present disclosure, a semiconductor device includes a lower structure including an interconnection; a source contact structure over the lower structure; a first contact plug that is coupled to the interconnection and penetrates the source contact structure; a first alternating stack positioned over the first contact plug and including first dielectric layers and gate-level dielectric layers that are alternately stacked; a second alternating stack positioned adjacent to the first alternating stack and including second dielectric layers and gate electrodes that are alternately stacked; void-free line-type supporters between the first alternating stack and the second alternating stack; a second contact plug coupled to the first contact plug and penetrating the first alternating stack between the void-free line-type supporters; a conformal sidewall liner surrounding a sidewall of the second contact plug; and gate contact plugs coupled to edges of the gate electrodes of the second alternating stack.

DETAILED DESCRIPTION

Figure 1:
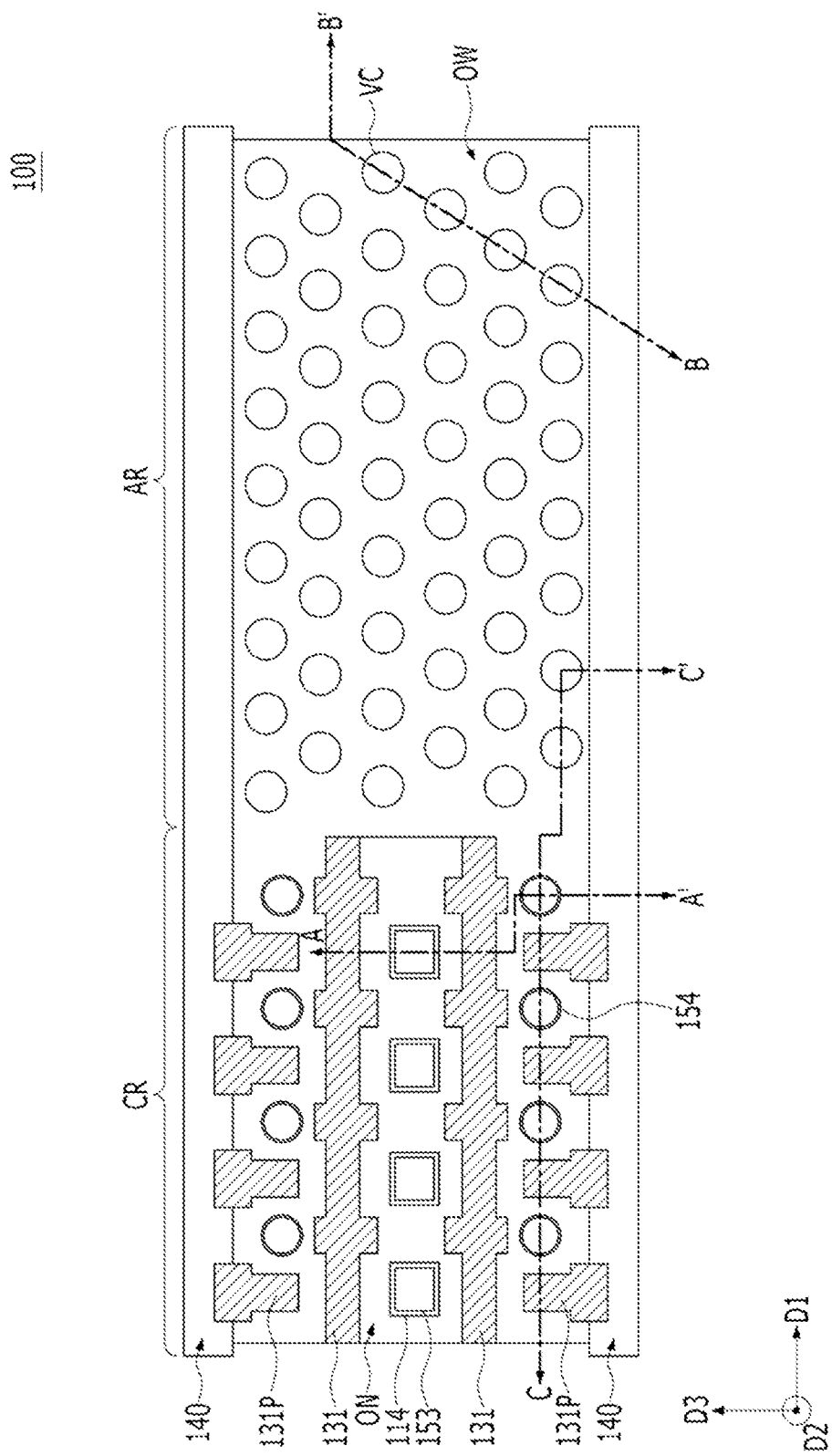
FIG. 1 is a layout diagram illustrating a semiconductor device in accordance with an embodiment of the present disclosure.

Some embodiments of the present disclosure will be described below in more detail with reference to the accompanying drawings. The present teachings may, however, be embodied in different forms and should not be construed as being limited to the embodiments set forth herein. Rather, these embodiments are provided so that this disclosure will be enabling to those skilled in the art. Throughout the disclosure, like reference numerals refer to like parts throughout the various figures and embodiments.

The drawings are not necessarily to scale and in some instances, proportions may be exaggerated in order to clearly illustrate features of the embodiments. When a first layer is referred to as being "on" a second layer or "on" a substrate, it not only refers to a case where the first layer is formed directly on the second layer or the substrate but also to a case where a third layer exists between the first layer and the second layer or the substrate.

Figure 2A:
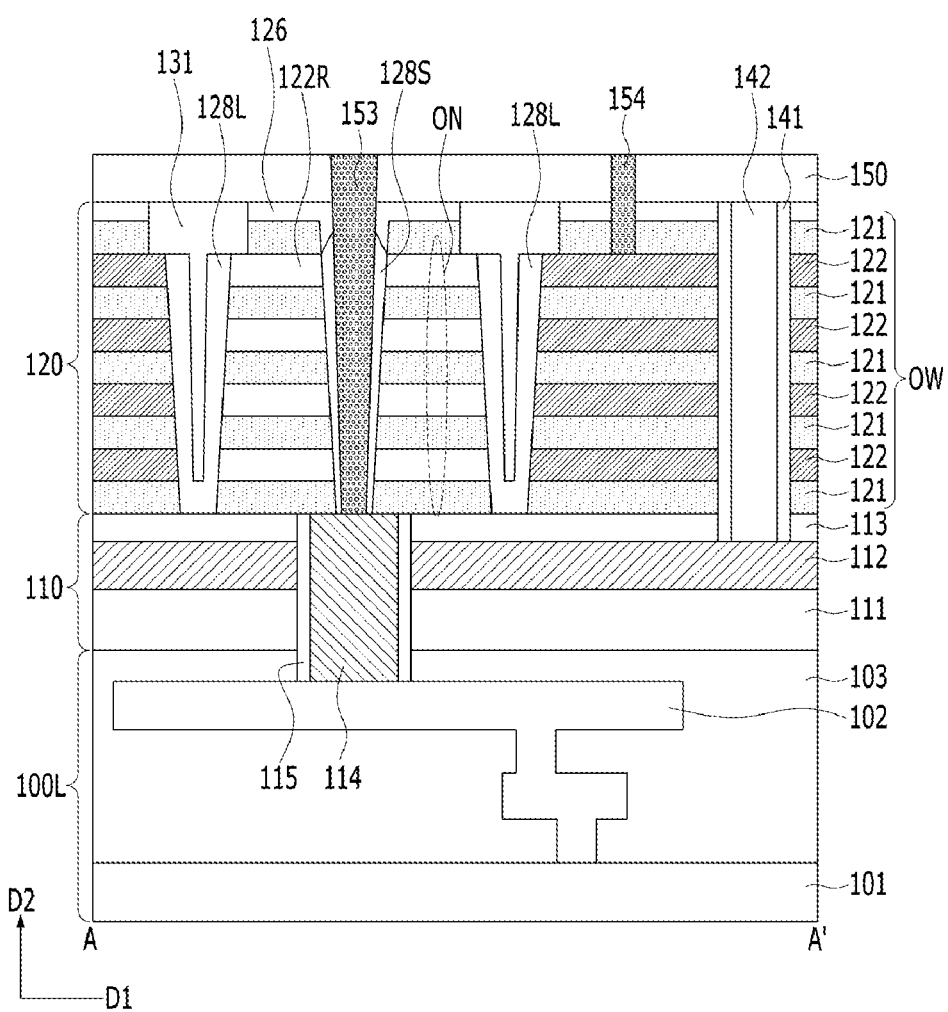
FIG. 2A is a cross-sectional view taken along a line A-A' shown in FIG. 1.
Figure 2B:
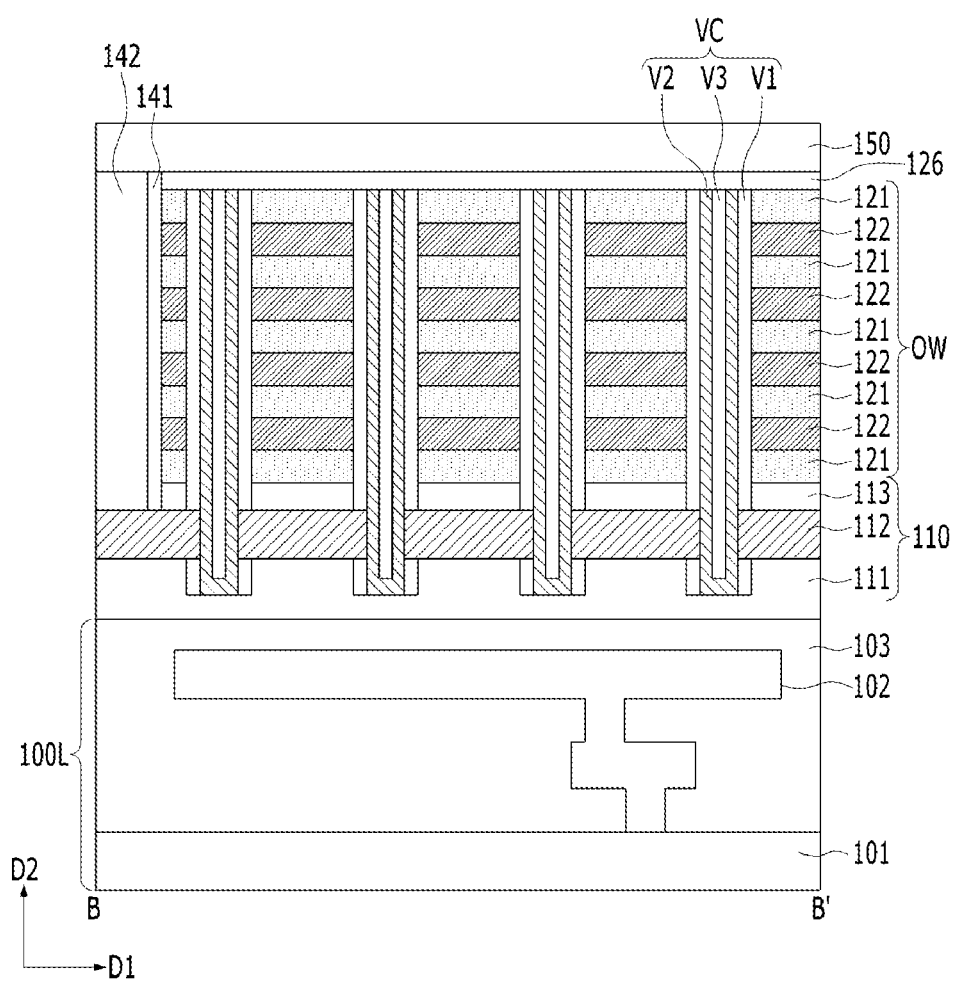
FIG. 2B is a cross-sectional view taken along a line B-B' shown in FIG. 1.
Figure 2C:
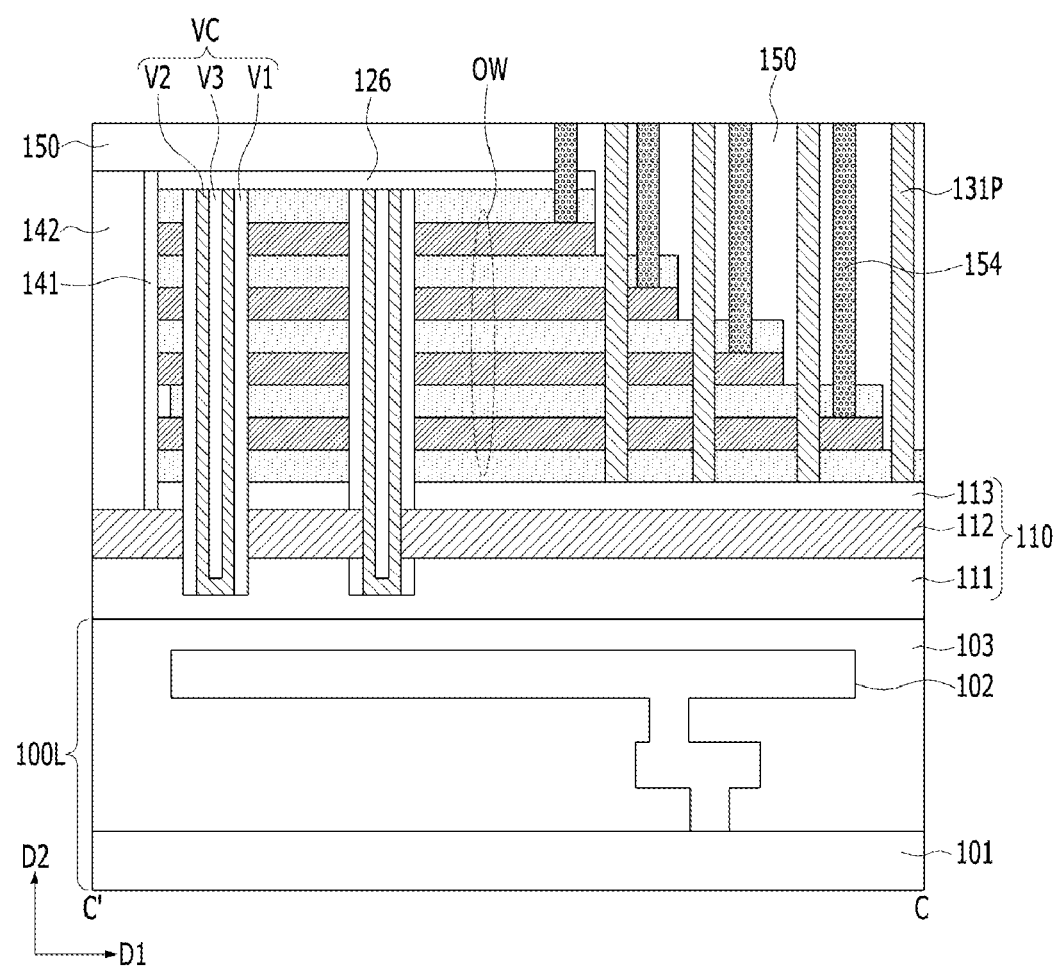
FIG. 2C is a cross-sectional view taken along a line C-C' shown in FIG. 1.

FIG. 1 is a layout diagram illustrating a semiconductor device 100 in accordance with an embodiment. FIG. 2A is a cross-sectional view taken along a line A-A' shown in FIG. 1. FIG. 2B is a cross-sectional view taken along a line B-B' shown in FIG. 1. FIG. 2C is a cross-sectional view taken along a line C-C' shown in FIG. 1.

Referring to FIGS. 1 and 2A to 2C, the semiconductor device 100 may include a lower structure 100L disposed over a semiconductor substrate 101. The lower structure 100L may include a transistor (not shown) and interconnections 102. The transistor may include, for example, an NMOSFET, a PMOSFET, a CMOSFET, or the like. The transistors and the interconnections 102 may be covered with an inter-layer dielectric layer 103. The lower structure 100L may function as a circuit for operating a memory cell included in a memory device. The lower structure 100L may be referred to as a peripheral circuit portion. The semiconductor device 100 may include a vertical NAND.

A source structure 110 may be formed over the lower structure 100L. The source structure 110 may include source conductive layers 111 and 113, and a source level contact layer 112 positioned between the source conductive layers 111 and 113. The source conductive layers 111 and 113 and the source level contact layer 112 may include a semiconductor material. The source level contact layer 112 may be doped with a conductive impurity, such as phosphorus, arsenic, boron, and the like. For example, the source level contact layer 112 may include phosphorus-doped polysilicon. According to another embodiment, the source level contact layer 112 may be doped with a non-conductive impurity or with a conductive impurity and a non-conductive impurity. For example, the source level contact layer 112 may include polysilicon doped with carbon. According to another embodiment, the source level contact layer 112 may include a double layer of phosphorus-doped polysilicon and carbon-doped polysilicon. The source conductive layers 111 and 113 and the source level contact layer 112 may include polysilicon.

A first contact plug 114 penetrating the source structure 110 may be formed, and a spacer 115 may be formed on a sidewall of the first contact plug 114. The first contact plug 114 may be coupled to at least one among the interconnections 102 of the lower structure 100L.

An upper structure 120 may be formed over the source structure 110. The upper structure 120 may include a first alternating stack ON and a second alternating stack OW. In the second alternating stack OW, dielectric layers 121 and gate electrodes 122 may be alternately stacked in a vertical D2 direction. In the first alternating stack ON, the dielectric layers 121 and gate-level dielectric layers 122R may be alternately stacked in the vertical D2 direction. The second alternating stack OW may include two end portions, and the first alternating stack ON may be positioned between the end portions of the second alternating stack OW. The two end portions of the second alternating stack OW may be regions in which pad portions of the gate electrodes 122 are formed. The height of the second alternating stack OW and the height of the first alternating stack ON may be the same. The second alternating stack OW may be positioned in a cell array region AR, and the first alternating stack ON may be positioned in a contact region CR. The contact region CR may include a region in which the pad portions of the gate electrodes 122 are formed. The contact region CR may further include a region in which a first contact plug 114 coupled to the interconnections 102 are formed.

A plurality of supporters 131 and 131P penetrating the upper structure 120 may be formed. The supporters 131 and 131P may include line-type supporters 131 and pillar-type supporters 131P. The line-type supporters 131 may be formed between the ends of the second alternating stack OW and the first alternating stack ON, and the line-type supporters 131 may extend in a first direction D1. The pillar-type supporters 131P may penetrate the end portions of the second alternating stack OW in the second direction D2. The first alternating stack ON may be positioned between the line-type supporters 131.

A conformal liner 128L may be formed on a sidewall of the line-type supporter 131. The line-type supporter 131 and the pillar-type supporters 131P may be void-free supporters.

A second contact plug 153 may be formed penetrating the first alternating stack ON. The second contact plug 153 may be formed over the first contact plug 114. The first contact plug 114 and the second contact plug 153 may be formed of the same material. The first contact plug 114 may have a larger width than the second contact plug 153. A conformal sidewall liner 128S may be formed on the sidewall of the second contact plug 153. A non-conformal layer 126 may be formed over the conformal sidewall liner 128S. The non-conformal layer 126 may be formed over the uppermost dielectric layer 121.

A plurality of channel structures VC penetrating the second alternating stack OW of the upper structure 120 may be formed. The channel structure VC may include a memory layer V1 and a channel layer V2. The memory layer V1 may include an oxide-nitride-oxide (ONO) structure. The ONO structure may include a stack of an oxide, a nitride, and an oxide. The memory layer V1 may include a stack of a blocking layer, a charge trapping layer, and a tunnel dielectric layer. The blocking layer and the tunnel dielectric layer may include an oxide, and the charge trapping layer may include a nitride. The channel layer V2 may include a polysilicon layer. According to another embodiment, the blocking layer may include a high-k material, and the high-k material may include aluminum oxide or hafnium oxide. The channel layer V2 may have a cylinder shape having an inner space. The memory layer V1 may surround the outer wall of the channel layer V2. The channel structure VC may further include a core dielectric layer V3. The inner space of the channel layer V2 may be completely filled with the core dielectric layer V3. The core dielectric layer V3 may include silicon oxide or silicon nitride. Although not illustrated, a conductive pad coupled to an upper end of the channel layer V2 may be further formed after the core dielectric layer V3 is recessed. The gate electrodes 122 may surround the channel structure VC. The channel structure VC may penetrate the dielectric layers 121 and the gate electrodes 122.

The lower sidewall of the channel structure VC may be coupled to the source structure 110. For example, the channel layer V2 of the channel structure VC may be directly coupled to the source level contact layer 112. The memory layer V1 may be cut for direct contact between the channel layer V2 and the source level contact layer 112.

The ends of the gate electrodes 122 may be gate pad portions and they may be formed in a stepped structure. The ends of the gate electrodes 122 may be coupled to gate contact plugs 154, respectively. The inter-layer dielectric layer 150 may cover the stepped structure, and the gate contact plugs 154 may penetrate the inter-layer dielectric layer 150 to be coupled to the ends of the gate electrodes 122. The pillar-type supporters 131P may penetrate the stepped structure of the ends of the gate electrodes 122.

The source level contact layer 112 may be coupled to a source contact plug 142. A sealing layer 141 may be formed between the source contact plug 142 and the second alternating stack OW. The sealing layer 141 and the source contact plug 142 may fill a vertical slit 140. The sealing layer 141 may be formed on the sidewall of the vertical slit 140, and the source contact plug 142 may be formed over the sealing layer 141.

FIGS. 3 to 21 are diagrams illustrating an example of a method for fabricating a semiconductor device in accordance with an embodiment. In FIGS. 3 to 21, structures of the lower structure 100L other than the semiconductor substrate 101, the interconnections 102, and the inter-layer dielectric layer 103 are omitted. In FIGS. 3 to 21, the same reference numerals as those in FIGS. 1 to 2C may denote the same constituent elements.

Figure 3:
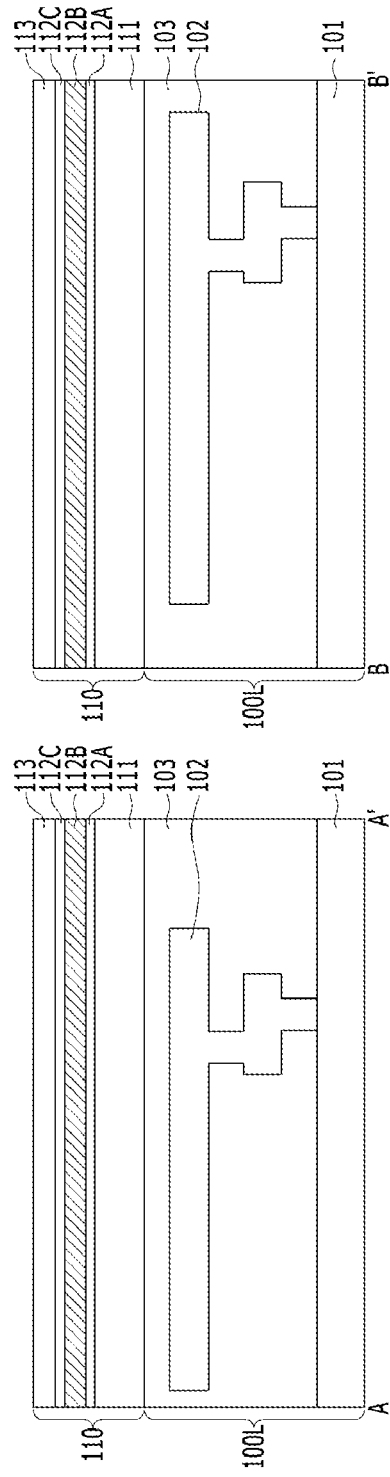
FIGS. 3 to 21 are diagrams illustrating a method for fabricating a semiconductor device in accordance with an embodiment of the present disclosure.

Referring to FIG. 3, a source structure 110 may be formed over a lower structure 100L including a semiconductor substrate 101, interconnections 102, and an inter-layer dielectric layer 103.

The semiconductor substrate 101 may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, a combination thereof, or a multi-layer thereof. The semiconductor substrate 101 may also include another semiconductor material, such as germanium. The semiconductor substrate 101 may include a III/V-group semiconductor substrate, for example, a compound semiconductor substrate, such as GaAs. The semiconductor substrate 101 may include a Silicon-On-Insulator (SOI) substrate. Although not illustrated, a transistor including a gate electrode may be formed over the semiconductor substrate 101.

The source structure 110 may have a multi-layer structure in which a sacrificial source layer 112B is positioned between the source conductive layers 111 and 113. The source structure 110 may further include a plurality of liner layers 112A and 112C. The liner layers 112A and 112C may be positioned between the source conductive layers 111 and 113 and the sacrificial source layer 112B.

The source conductive layers 111 and 113 and the sacrificial source layer 112B may have an etch selectivity with respect to the liner layers 112A and 112C. The source conductive layers 111 and 113 and the sacrificial source layer 112B may include a semiconductor material, and the liner layers 112A and 112C may include a dielectric material. The source conductive layers 111 and 113 and the sacrificial source layer 112B may include polysilicon, and the liner layers 112A and 112C may include silicon oxide. The liner layers 112A and 112C may be thinner than the source conductive layers 111 and 113 and the sacrificial source layer 112B. The sacrificial source layer 112B may have the same thickness as or may be thinner than the source conductive layers 111 and 113.

The liner layers 112A and 112C may protect the source conductive layers 111 and 113 while the subsequent sacrificial source layer 112B is removed.

The liner layers 112A and 112C may include a silicon oxide-based material. At least one liner layer among the liner layers 112A and 112C may include $SiO_2$, SiCO, or a combination thereof.

Figure 4:
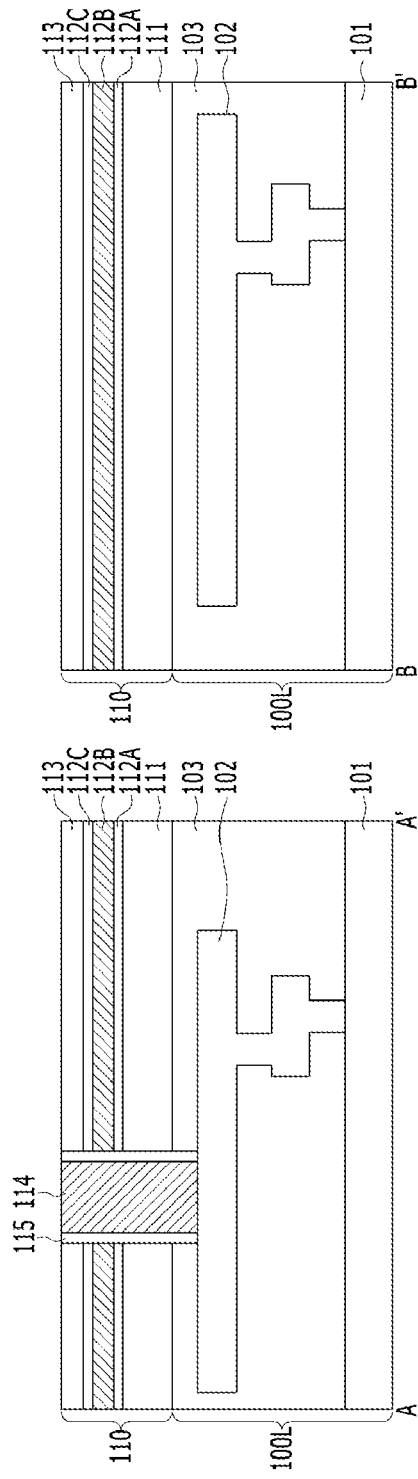

Referring to FIG. 4, a first contact plug 114 penetrating the source structure 110 may be formed. To form the first contact plug 114, a contact hole (not shown) may be formed to penetrate the source structure 110 and the inter-layer dielectric layer 103, and then the contact hole may be filled with a conductive material. The first contact plug 114 may include tungsten. The first contact plug 114 may be referred to as a 'tungsten plug'. For example, in order to form the first contact plug 114, a tungsten layer may be deposited and then a planarization process may be performed. The spacer 115 may be formed on the sidewall of the first contact plug 114, and the spacer 115 may be formed on the sidewall of the contact hole before the first contact plug 114 is formed.

The first contact plug 114 may penetrate the source structure 110 to be electrically connected to the interconnections 102.

Figure 5:
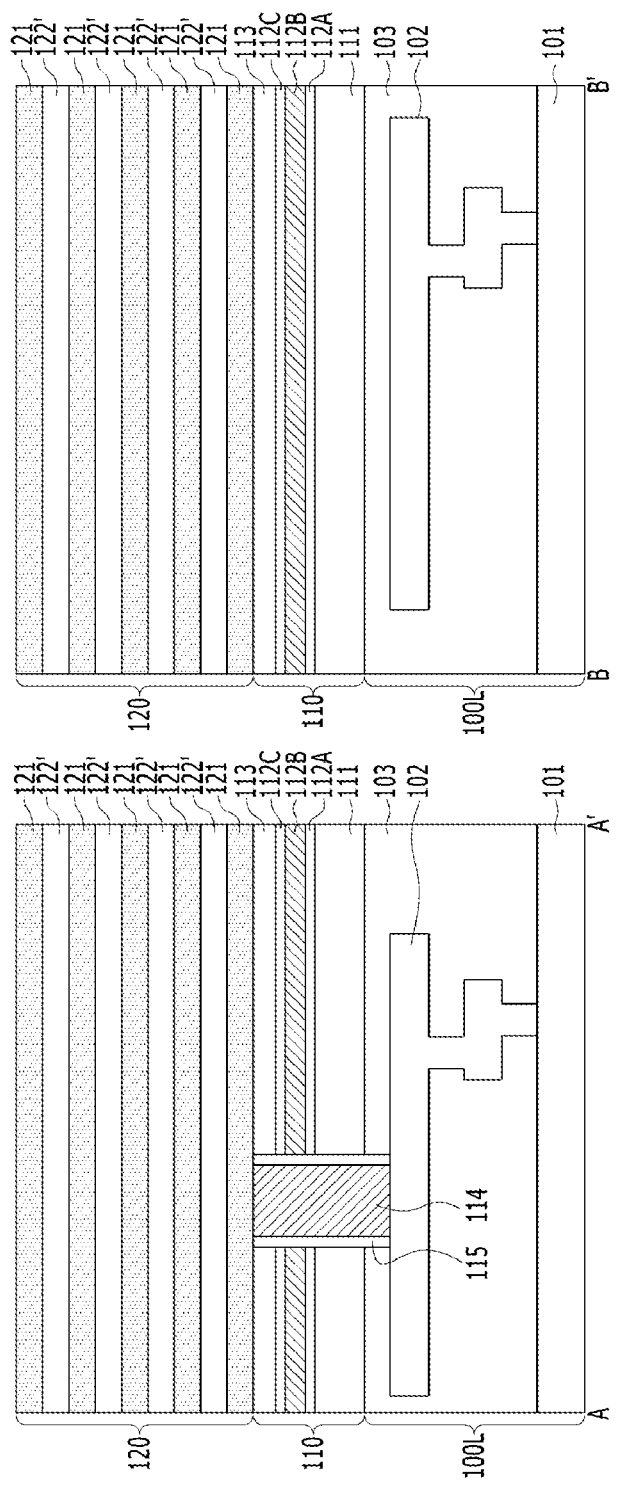

Referring to FIG. 5, the upper structure 120 may be formed over the first contact plug 114. The upper structure 120 may include an alternating stack in which dielectric layers 121 and sacrificial layers 122' are alternately stacked. The height of the upper structure 120 may be greater than the height of the source structure 110.

The dielectric layer 121 and the sacrificial layer 122' may be formed of different materials. The dielectric layer 121 may have an etch selectivity with respect to the sacrificial layer 122'. The dielectric layer 121 may include silicon oxide, and the sacrificial layer 122' may include silicon nitride. The dielectric layer 121 and the sacrificial layer 122' may have the same thickness. The dielectric layer 121 and the sacrificial layer 122' may be thicker than the liner layers 112A and 112C, and the dielectric layer 121 and the sacrificial layer 122' may be thinner than the source conductive layers 111 and 113.

The dielectric layer 121 and the sacrificial layer 122' may be formed using a Chemical Vapor Deposition (CVD) process or an Atomic Layer Deposition (ALD) process. According to another embodiment, among the dielectric layers 121, the lowermost dielectric layer 121 and the uppermost dielectric layer 121 may be formed to be thicker than the other dielectric layers 121.

The dielectric layer 121 and the liner layers 112A and 112C may be formed of the same material. According to another embodiment, the liner layers 112A and 112C may have an etch selectivity with respect to the dielectric layer 121.

Although not illustrated, after the upper structure 120 is formed, a stepped structure (not shown) may be formed in a region of the contact region of the upper structure 120 in which a pad portion is to be formed.

Figure 6:
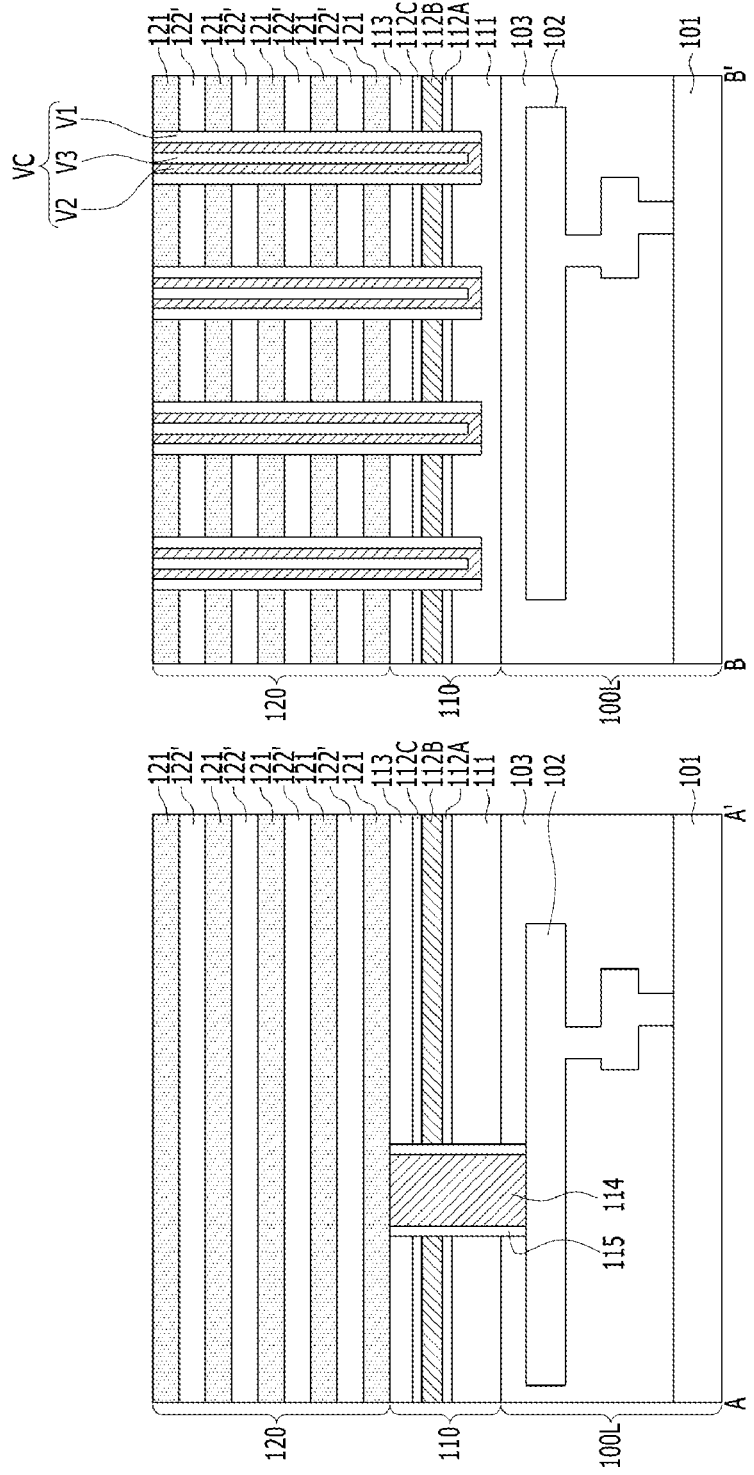

Referring to FIG. 6, a channel structure VC may be formed to penetrate the cell array region of the upper structure 120. The channel structure VC may have a pillar shape. The lower portion of the channel structure VC may extend into the inside of the source structure 110. The lower portion of the channel structure VC might not penetrate the source conductive layer 111 of the source structure 110.

The channel structure VC may include a memory layer V1 and a channel layer V2. The memory layer V1 may include an ONO structure. The ONO structure may include a stack of an oxide, a nitride, and an oxide. The memory layer V1 may include a stack of a blocking layer, a charge trapping layer, and a tunnel dielectric layer. The blocking layer and the tunnel dielectric layer may include an oxide, and the charge trapping layer may include a nitride. The channel layer V2 may include a polysilicon layer. According to another embodiment, the blocking layer may include a high-k material, and the high-k material may include aluminum oxide or hafnium oxide.

The channel layer V2 may have a cylinder shape having an inner space. The memory layer V1 may surround the outer wall of the channel layer V2.

The channel structure VC may further include a core dielectric layer V3. The inner space of the channel layer V2 may be completely filled with the core dielectric layer V3. The core dielectric layer V3 may include silicon oxide or silicon nitride. Although not illustrated, a conductive pad coupled to the upper end of the channel layer V2 may be further formed after the core dielectric layer V3 is recessed.

Figure 7:
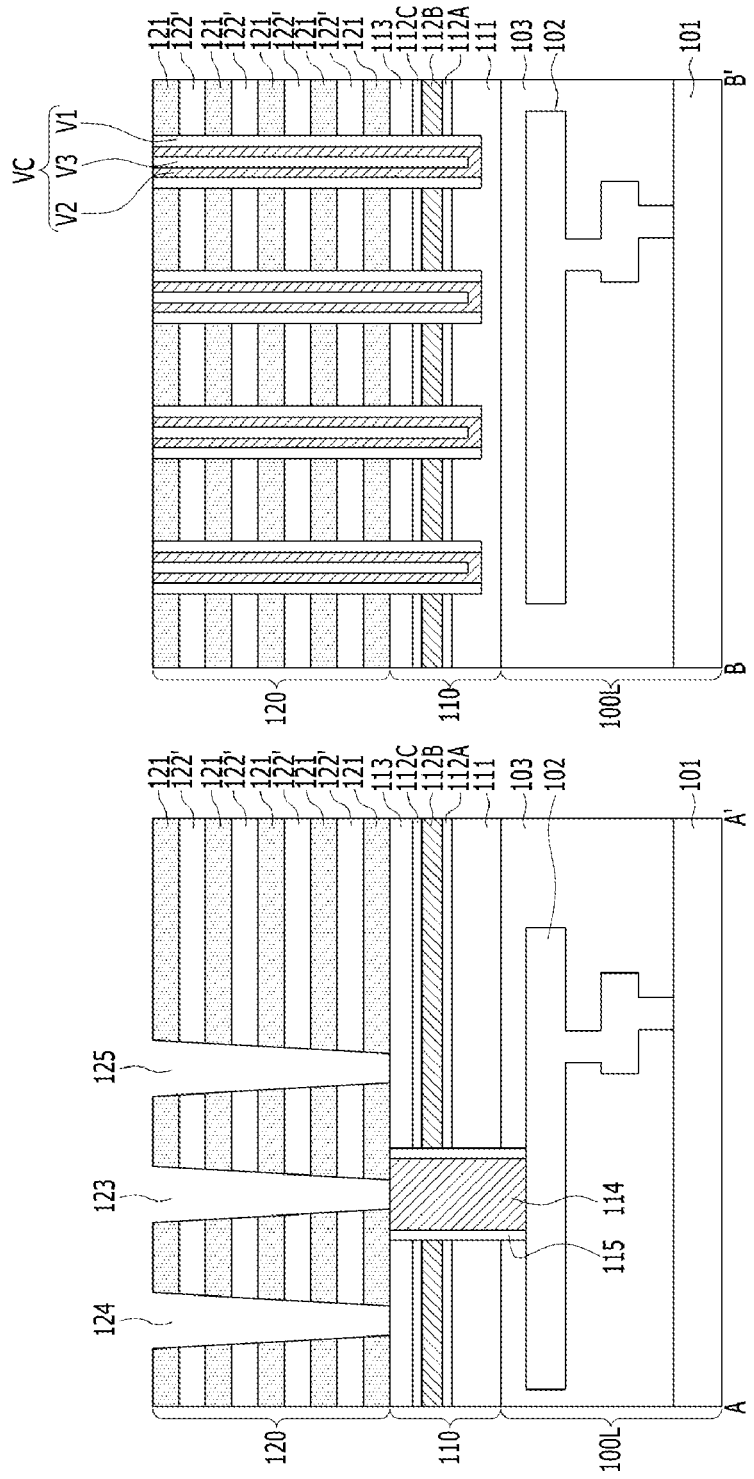

Referring to FIG. 7, a plurality of upper level openings 123, 124, and 125 may be formed in the contact region of the upper structure 120. The upper level openings 123, 124, and 125 may include a first upper level opening 123, a second upper level opening 124, and a third upper level opening 125. From the perspective of a top view, the first upper level opening 123 may be a hole-type opening, and the second and third upper level openings 124 and 125 may be line-type openings having a plurality of branches. The first upper level opening 123 may be positioned between the second upper level opening 124 and the third upper level opening 125. The first upper level opening 123 may expose the upper surface of the first contact plug 114.

In order to form the upper level openings 123, 124, and 125, the upper structure 120 may be etched.

Figure 8:
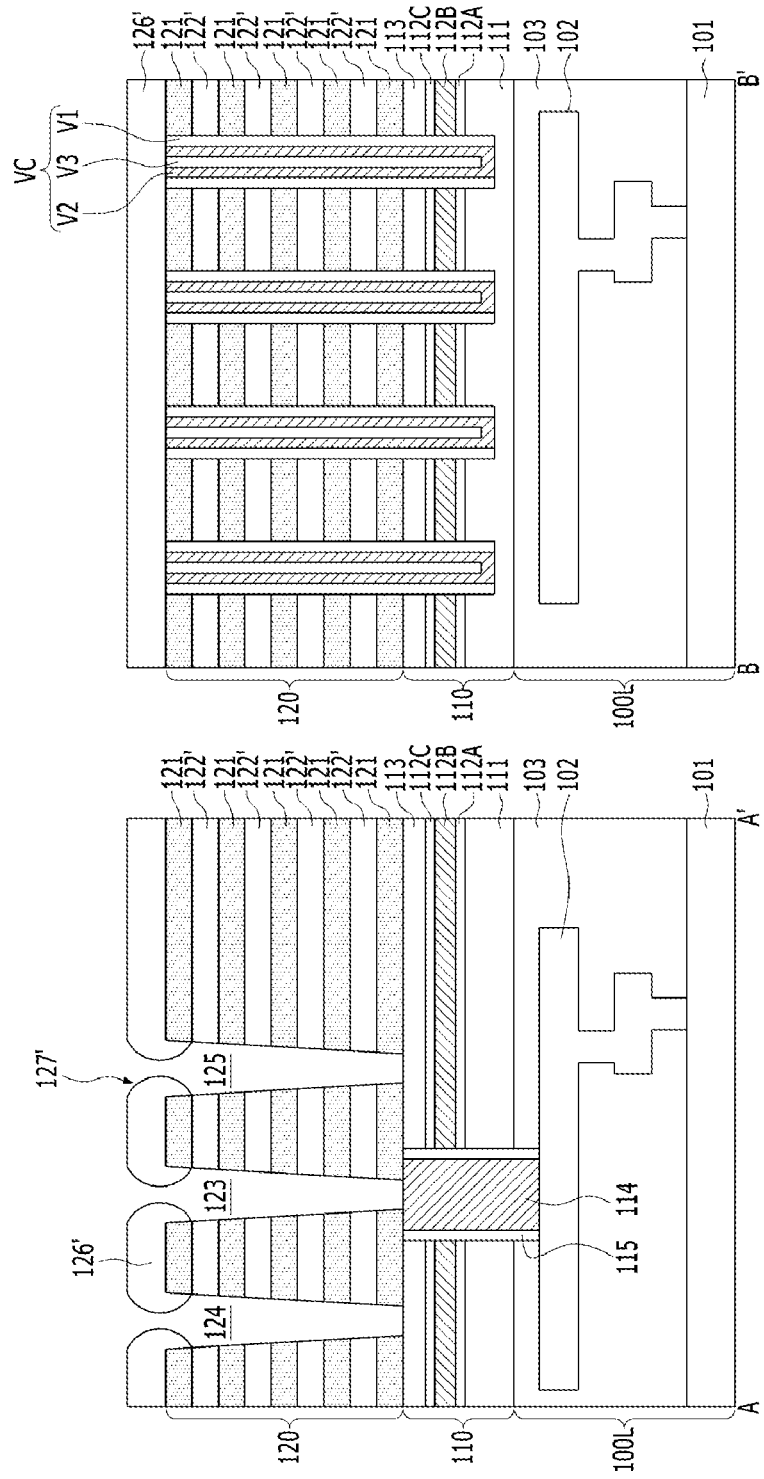

Referring to FIG. 8, a non-conformal layer 126' may be formed over the upper level openings 123, 124, and 125. The non-conformal layer 126' may include an overhang 127', and the non-conformal layer 126' might not fill the upper level openings 123, 124, and 125. The non-conformal layer 126' may be formed of a material having poor step coverage. The non-conformal layer 126' may include an oxide, and an oxide having poor step coverage may include silicon oxide deposited by a Plasma Chemical Vapor Deposition method. The non-conformal layer 126' may include plasma enhanced tetraethylorthosilicate (PETEOS).

Figure 9:
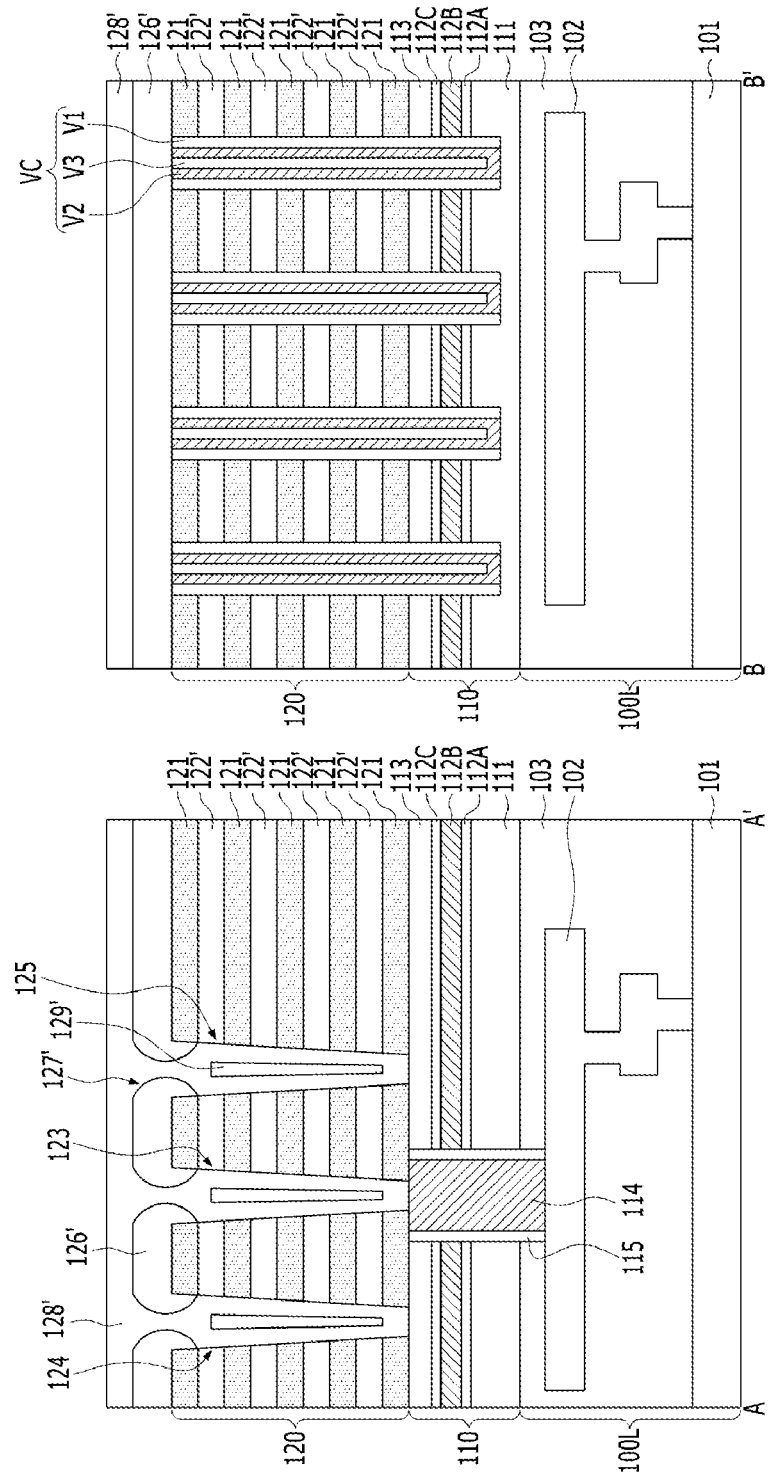

Referring to FIG. 9, a conformal layer 128' may be formed over the non-conformal layer 126'. The conformal layer 128' may be formed of a material having good step coverage. For example, the material of the conformal layer 128' may have better step coverage than the material of the conformal layer 126'. The conformal layer 128' may be formed by an Atomic Layer Deposition (ALD) method. The conformal layer 128' may include an oxide, for example, silicon oxide deposited by an ALD method.

After the conformal layer 128' is formed, the upper level openings 123, 124, and 125 may individually include voids 129'. The voids 129' may be formed by the overhang 127' of the non-conformal layer 126' during the deposition of the conformal layer 128'. The conformal layer 128' may be a void-embedded silicon oxide. The size of the void 129' may be sufficiently large to prevent the void 129' from remaining closed off when the subsequent contact hole 151 is formed.

Figure 10:
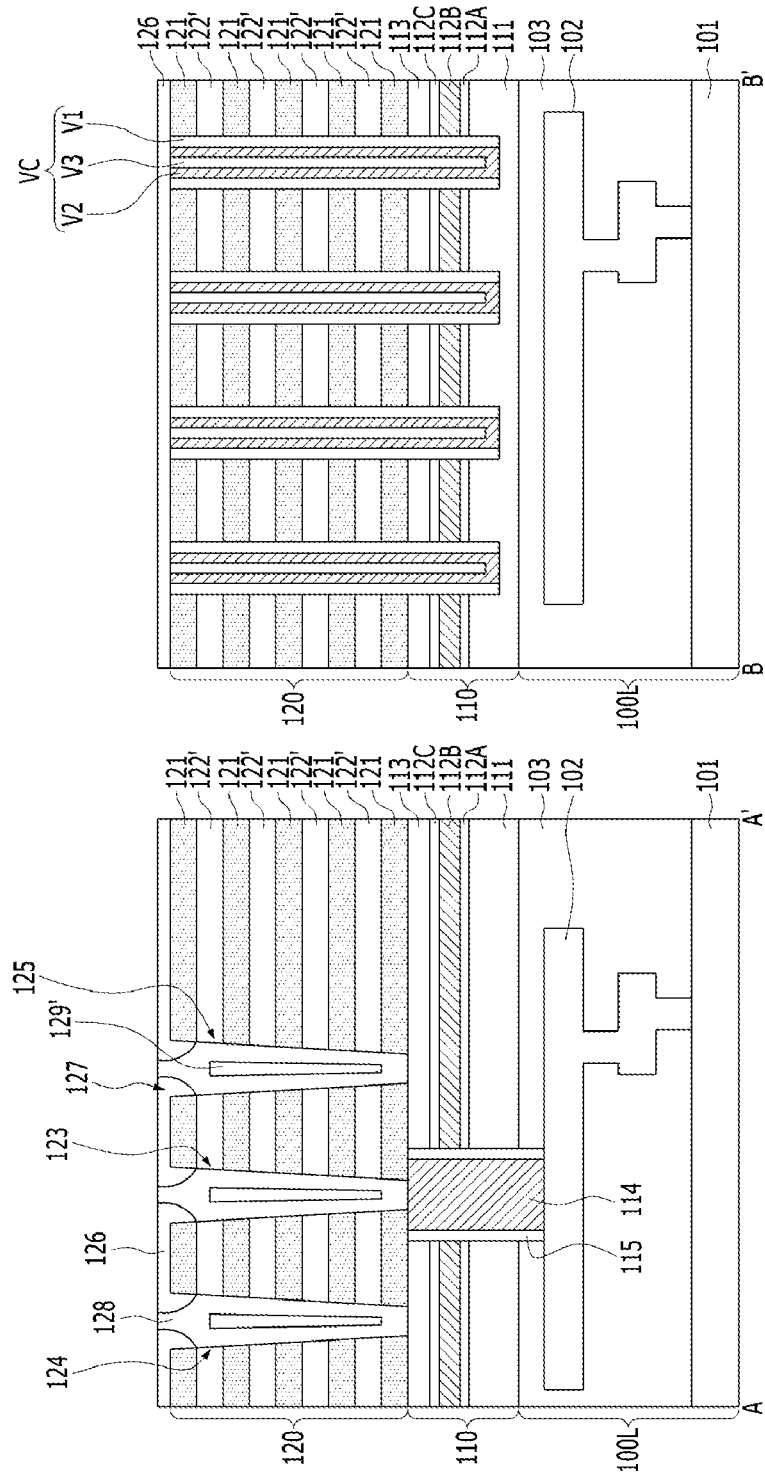

Referring to FIG. 10, the conformal layer 128' and the non-conformal layer 126' may be planarized. Even after the planarization of the conformal layer 128' and the non-conformal layer 126', each of the upper level openings 123, 124, and 125 may include the voids 129'. The planarized conformal layer 128 and the planarized non-conformal layer 126 may have top surfaces of the same level. The height of the overhang 127' may be reduced due to the planarization of the non-conformal layer 126', and the overhang 127 with the reduced height may cover the top corners of the upper level openings 123, 124, and 125. The planarized conformal layer 128 may be referred to as a sacrificial supporter.

Figure 11:
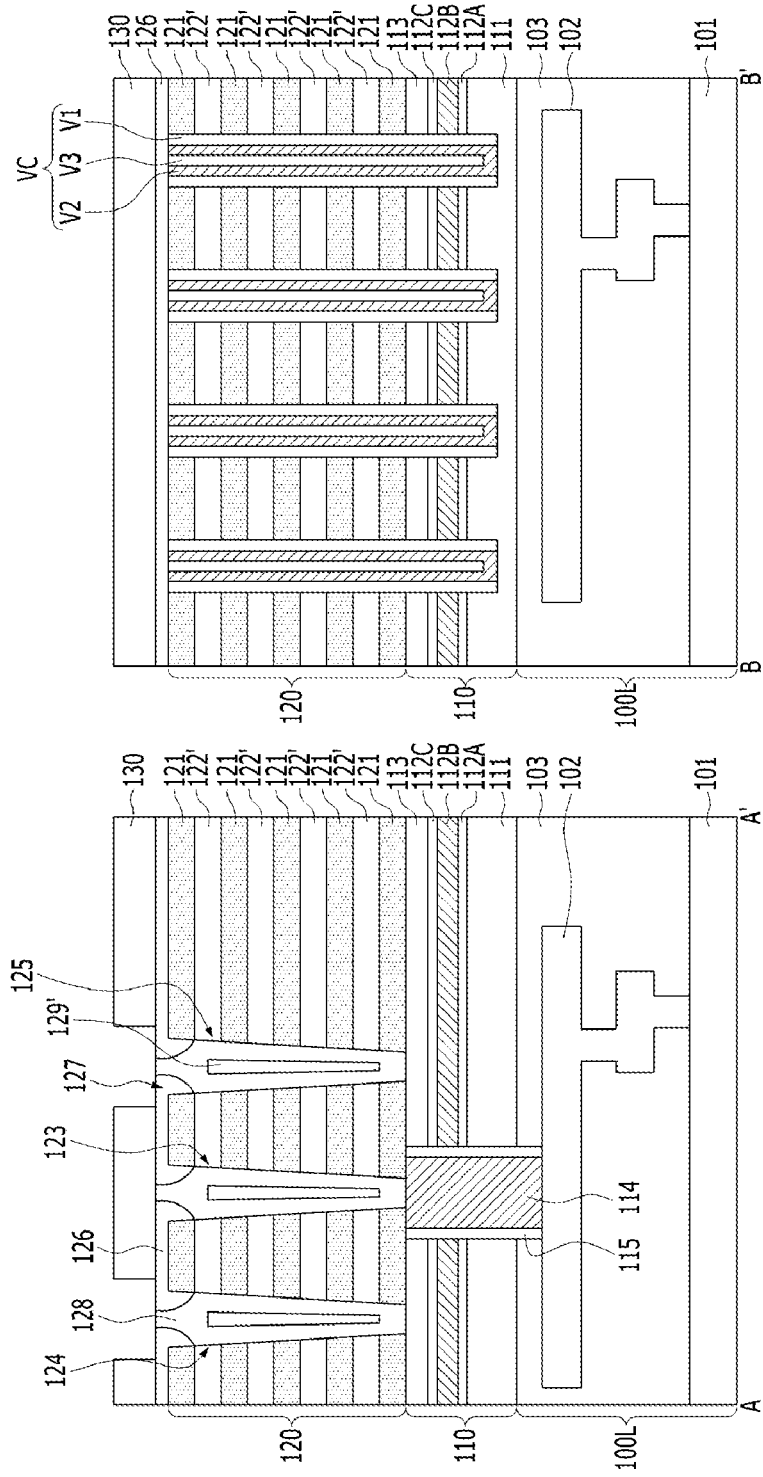

Referring to FIG. 11, a mask layer 130 may be formed. The mask layer 130 may selectively expose the upper surfaces of the conformal layer 128 and the non-conformal layer 126. The mask layer 130 may include a photoresist pattern. The mask layer 130 may include a hard mask material having an etch selectivity with respect to the conformal layer 128 and the non-conformal layer 126. The mask layer 130 may selectively expose the conformal layer 128 and the non-conformal layer 126 of the second and third upper level openings 124 and 125 and cover the conformal layer 128 and the non-conformal layer 126 of the first upper level opening 123.

Figure 12:
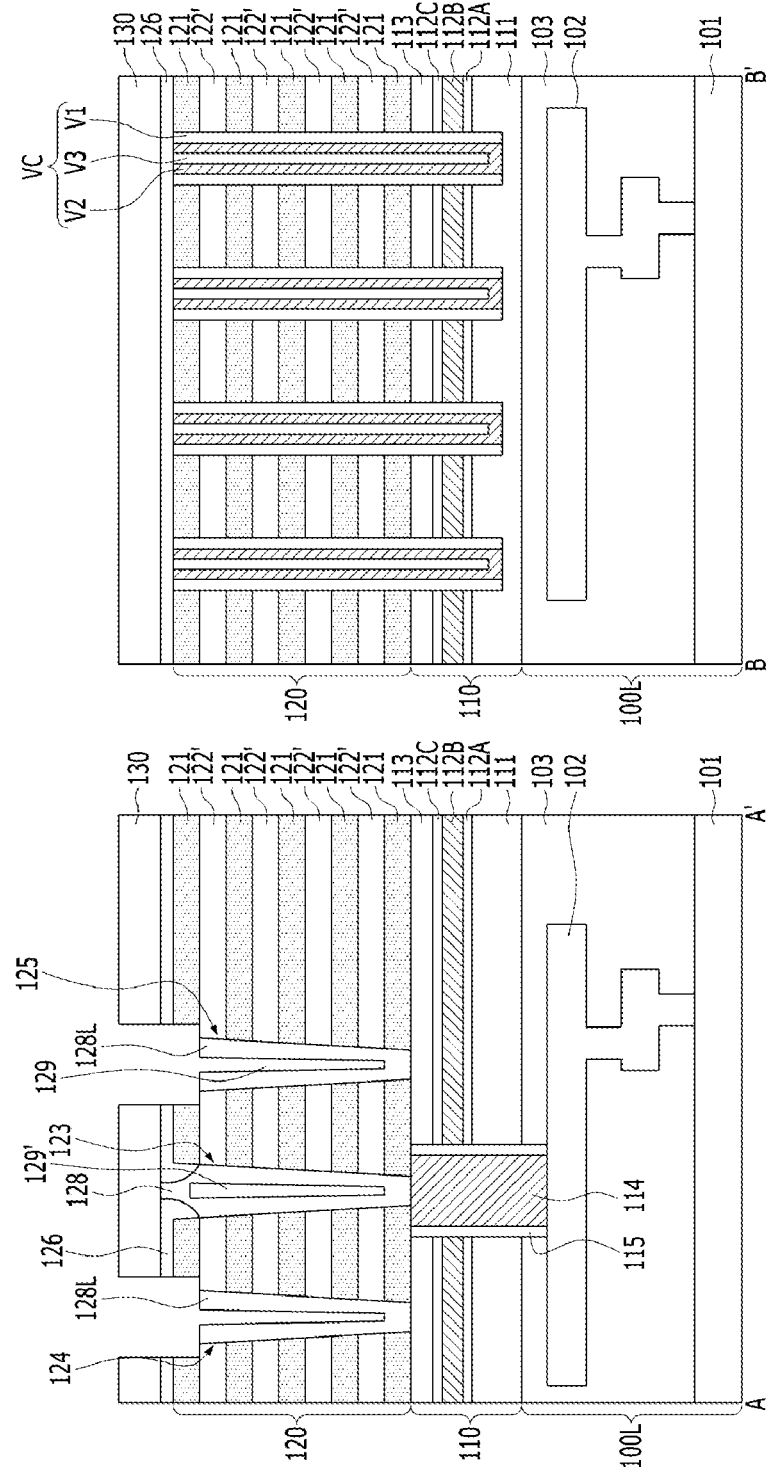

Referring to FIG. 12, the conformal layer 128 and the non-conformal layer 126 formed in the second and third upper level openings 124 and 125 may be selectively etched by using the mask layer 130. Accordingly, the second and third upper level openings 124 and 125 may be partially exposed. In other words, the conformal liner 128L may remain in the second and third upper level openings 124 and 125, and a void 129 may be exposed. The exposed void 129 may be abbreviated as an open void. The conformal liner 128L may be formed by etching the conformal layer 128 and may cover the sidewalls and bottom surfaces of the second and third upper level openings 124 and 125. The first upper level opening 123 may be filled with the conformal layer 128 and a void 129'. The void 129' in the first upper level opening 123 may be abbreviated as a closed void or an embedded void. During the etching process using the mask layer 130, the uppermost dielectric layer 121 may be etched.

Figure 13:
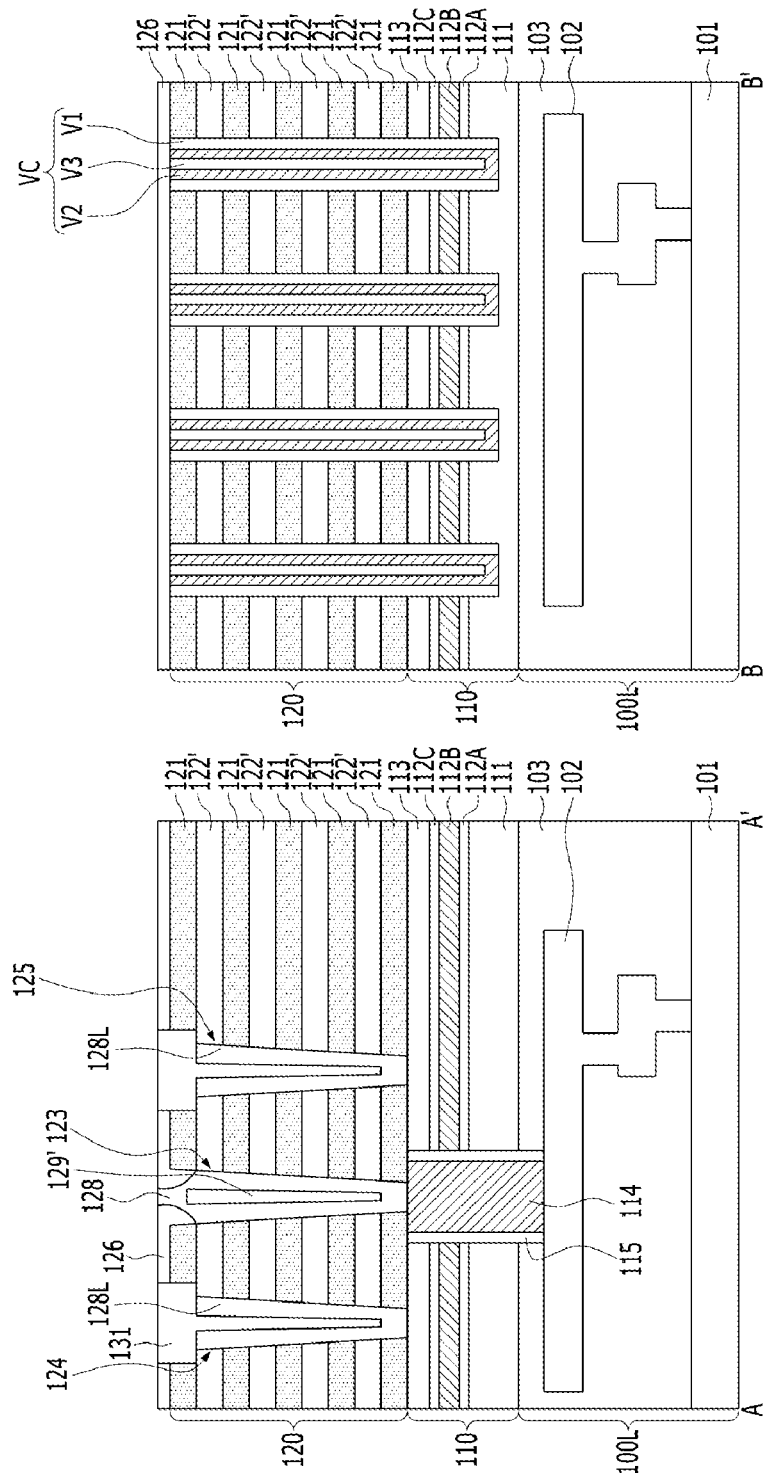

Referring to FIG. 13, after removing the mask layer 130, the second and third upper level openings 124 and 125 may be filled with a line-type supporter 131, and then the line-type supporter 131 may be planarized subsequently. The line-type supporter 131 may be planarized until the upper surface of the non-conformal layer 126 is exposed.

The line-type supporter 131 may fill the second and third upper level openings 124 and 125 and might not fill the first upper level opening 123. The first upper level opening 123 may be filled with the conformal layer 128 and may include the closed void 129'. The open voids 129 (see FIG. 12) of the second and third upper level openings 124 and 125 may be filled with the supporter 131.

The line-type supporter 131 may be a void-free line-type supporter, and the line-type supporter 131 may be referred to as a silicon oxide supporter. According to another embodiment, the line-type supporter 131 may include a material having an etch selectivity with respect to a sacrificial layers 122'. The line-type supporter 131 may include $SiO_2$, SiCO, SiCN, SiBN, or SiBCN. Because the line-type supporter 131 is void-free, structural stability may be improved. The line-type supporter 131 may have a T-shape.

Although not illustrated, the pillar-type supporters 131P of FIG. 1 may be simultaneously formed while the line-type supporter 131 is formed. For example, as shown in FIGS. 7 to 13, the pillar-type supporters 131P may be formed by forming hole-type openings to be filled with pillar-type supporters as soon as forming the second and third upper level openings 124 and 125, and then performing the subsequent process. The pillar-type supporters 131P may be free of voids.

As described above, the void 129' formed by the non-conformal layer 126' and the conformal layer 128' may be replaced with a void-free supporter 131.

The conformal layer 128 and the non-conformal layer 126 including the closed voids 129' remaining in the first upper level opening 123 may form 'a void-embedded sacrificial plug'. Hereinafter, they may be abbreviated as a 'void-embedded sacrificial plug 126/128/129', and the void-embedded sacrificial plug 126/128/129' may contact the first contact plug 114. The non-conformal layer 126 of the void-embedded sacrificial plug 126/128/129' may contact the line-type supporter 131. The closed void 129' of the void-embedded sacrificial plug 126/128/129' may be embedded in the conformal layer 128 and might not contact the first contact plug 114.

Figure 14:
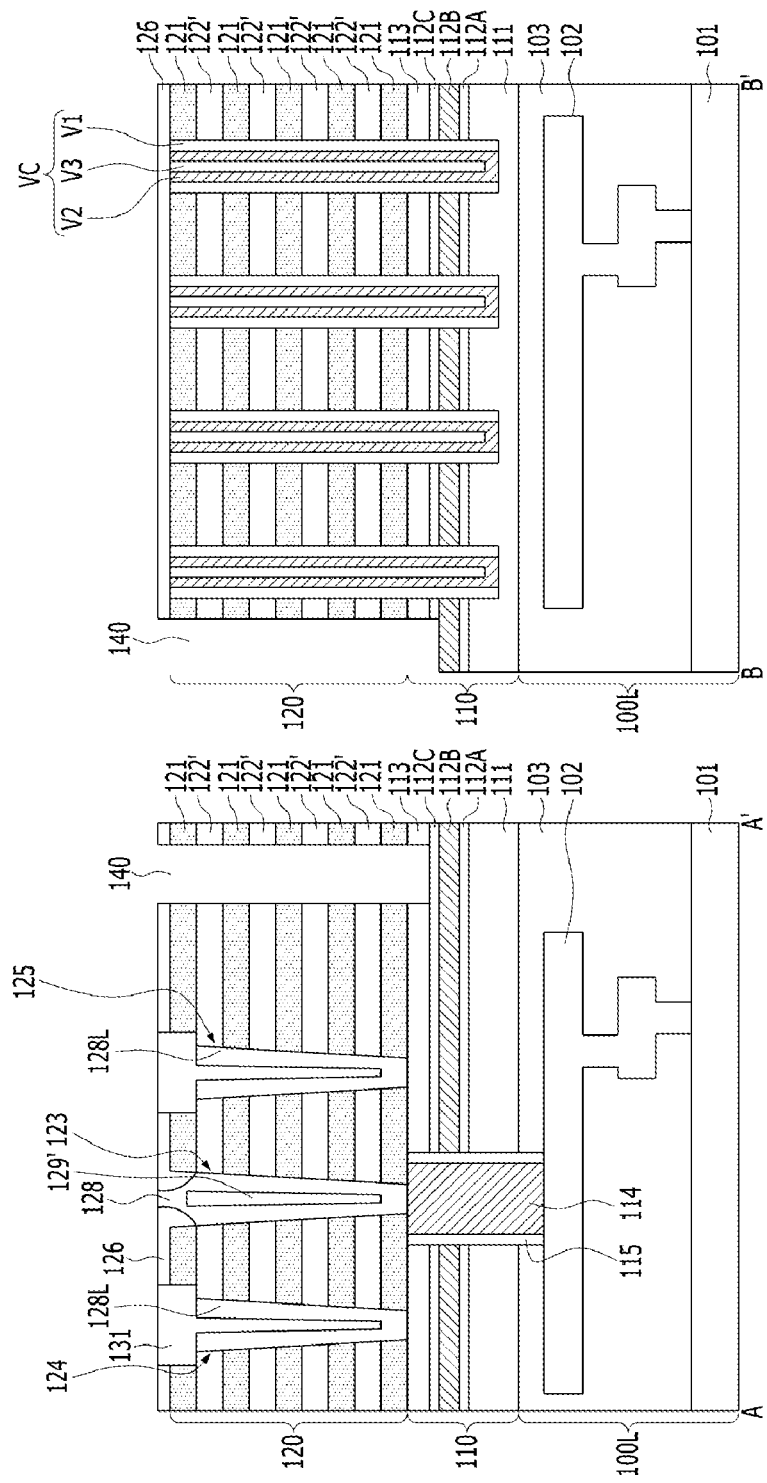

Referring to FIG. 14, a vertical slit 140 may be formed. The vertical slit 140 may be formed to be spaced apart from the channel structure VC. The vertical slit 140 may be formed by etching the upper structure 120, and the vertical slit 140 may extend downward to a part of the source structure 110. The bottom surface of the vertical slit 140 may penetrate the source conductive layer 113 and the liner layer 112C. The etching process for forming the vertical slit 140 may stop over the sacrificial source layer 112B. According to another embodiment, while forming the vertical slit 140, the upper surface of the sacrificial source layer 112B may be partially recessed. The vertical slit 140 may also be referred to as a slit or trench. From the perspective of a top view, the vertical slit 140 may have a line shape extending in one direction. The vertical slit 140 may have a high aspect ratio perpendicular to the surface of the lower structure 100L.

Figure 15:
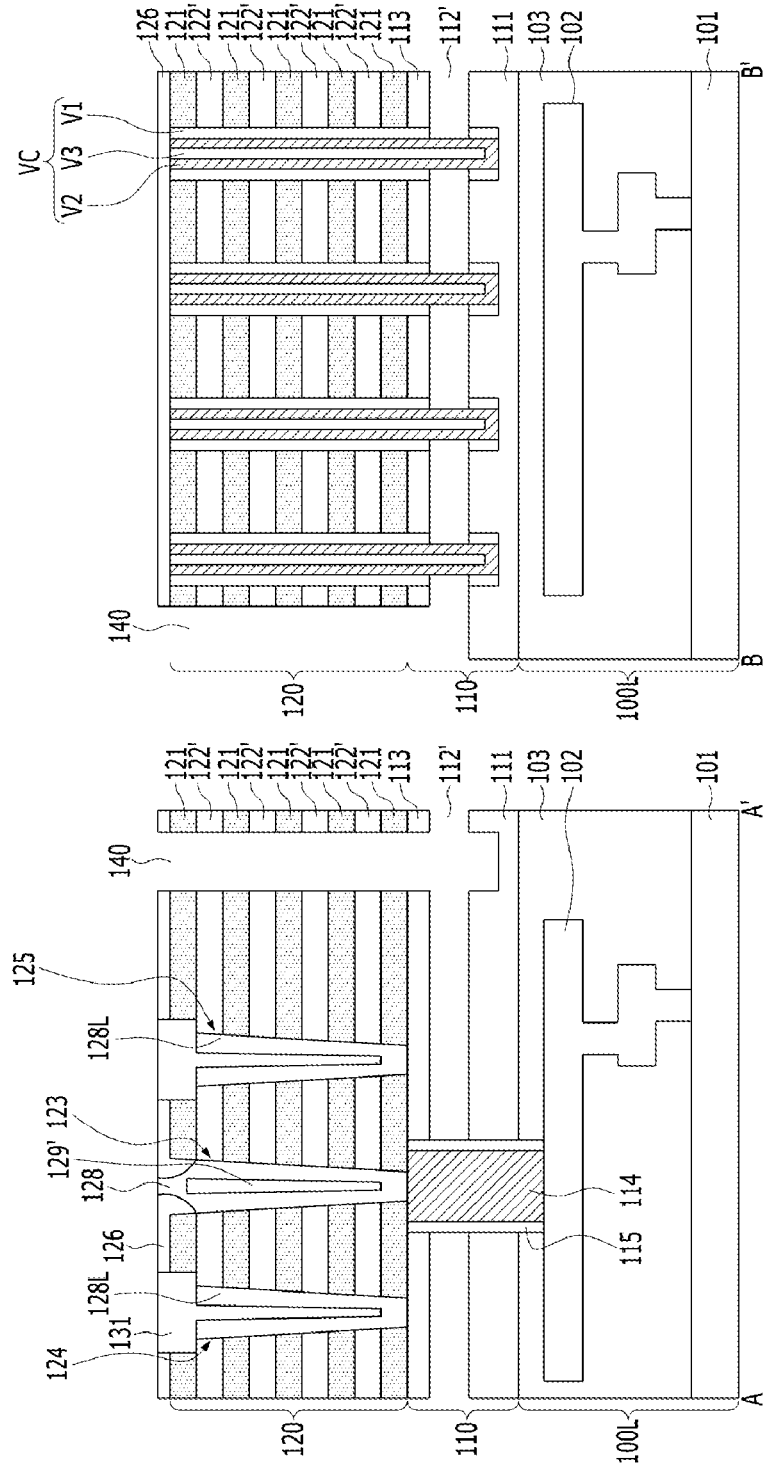

Referring to FIG. 15, a source level opening 112' may be formed. The sacrificial source layer 112B may be selectively removed to form the source level opening 112'.

The source level opening 112' may partially expose the lower outer walls of the channel structures 130. The source level opening 112' may be positioned between the source conductive layers 111 and 113. The source level opening 112' may not expose the first contact plug 114. The first contact plug 114 may be protected by the spacer 115 from the source level opening 112'.

A portion of the source level opening 112' may expose the lower outer wall of the channel structure VC. The source level opening 112' may have an annular-shape surrounding the lower outer wall of the channel structure VC. The source level opening 112' may be referred to as a source level air gap.

Subsequently, the liner layers 112A and 112C may be selectively removed. While the liner layers 112A and 112C are removed, portions of the channel structure VC may be removed. For example, a portion of the memory layer V1 may be removed to expose a portion of the channel layer V2. The source level opening 112' and the channel layer V2 may directly contact each other.

Figure 16:
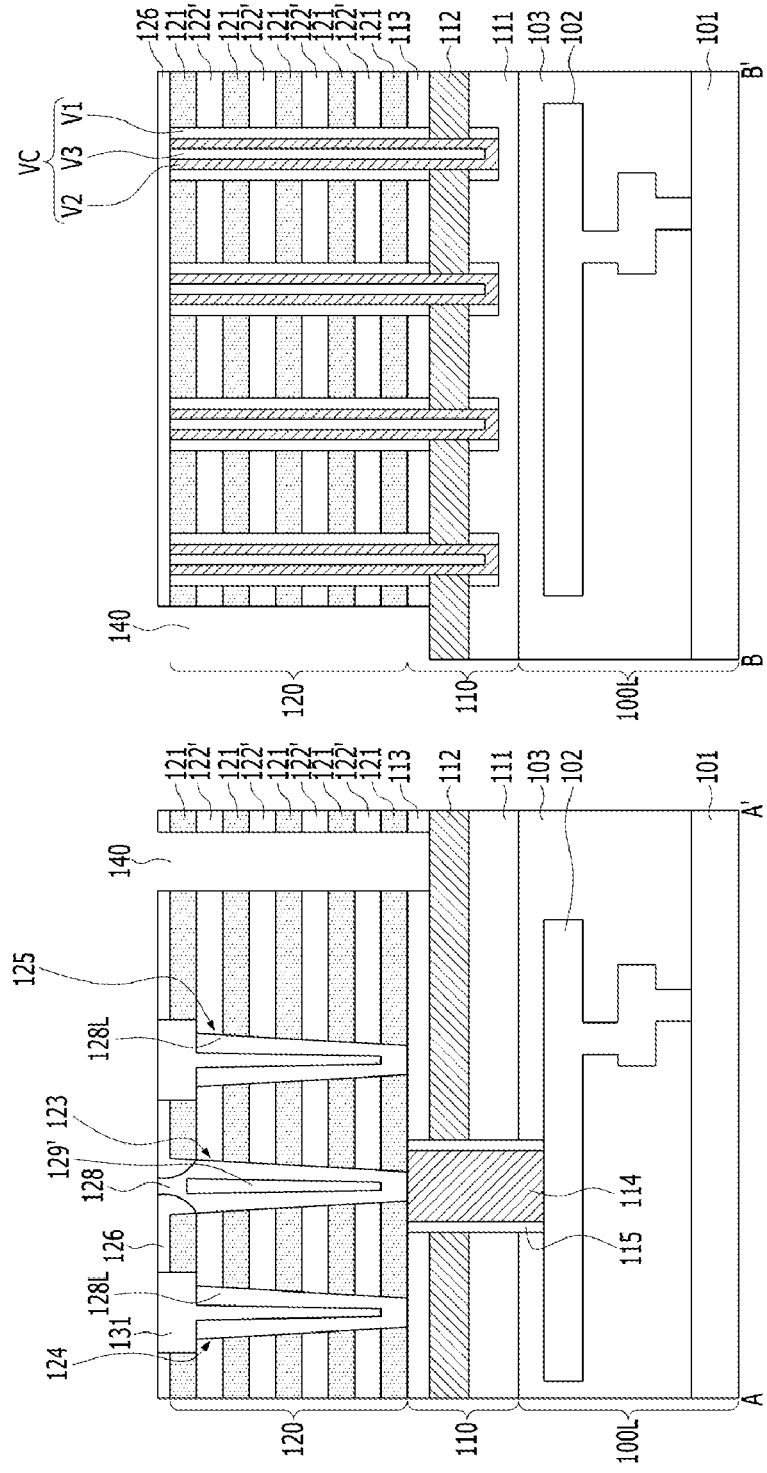

Referring to FIG. 16, a source level contact layer 112 filling the source level opening 112' may be formed. The source level contact layer 112 may include a conductive material. The source level contact layer 112 may include polysilicon. The source level contact layer 112 may be doped with a conductive impurity, such as phosphorus, arsenic, boron, or the like. For example, the source level contact layer 112 may include phosphorus-doped polysilicon. According to another embodiment, the source level contact layer 112 may be doped with a non-conductive impurity or with a conductive impurity and a non-conductive impurity. For example, the source level contact layer 112 may include polysilicon doped with carbon. According to another embodiment, the source level contact layer 112 may include a double layer of phosphorus-doped polysilicon and carbon-doped polysilicon. The first contact plug 114 and the source level contact layer 112 may be insulated by the spacer 115. The source level contact layer 112 and the source conductive layers 111 and 113 may contact each other. The source level contact layer 112 and the source conductive layers 111 and 113 may be referred to as a source level layer.

Figure 17:
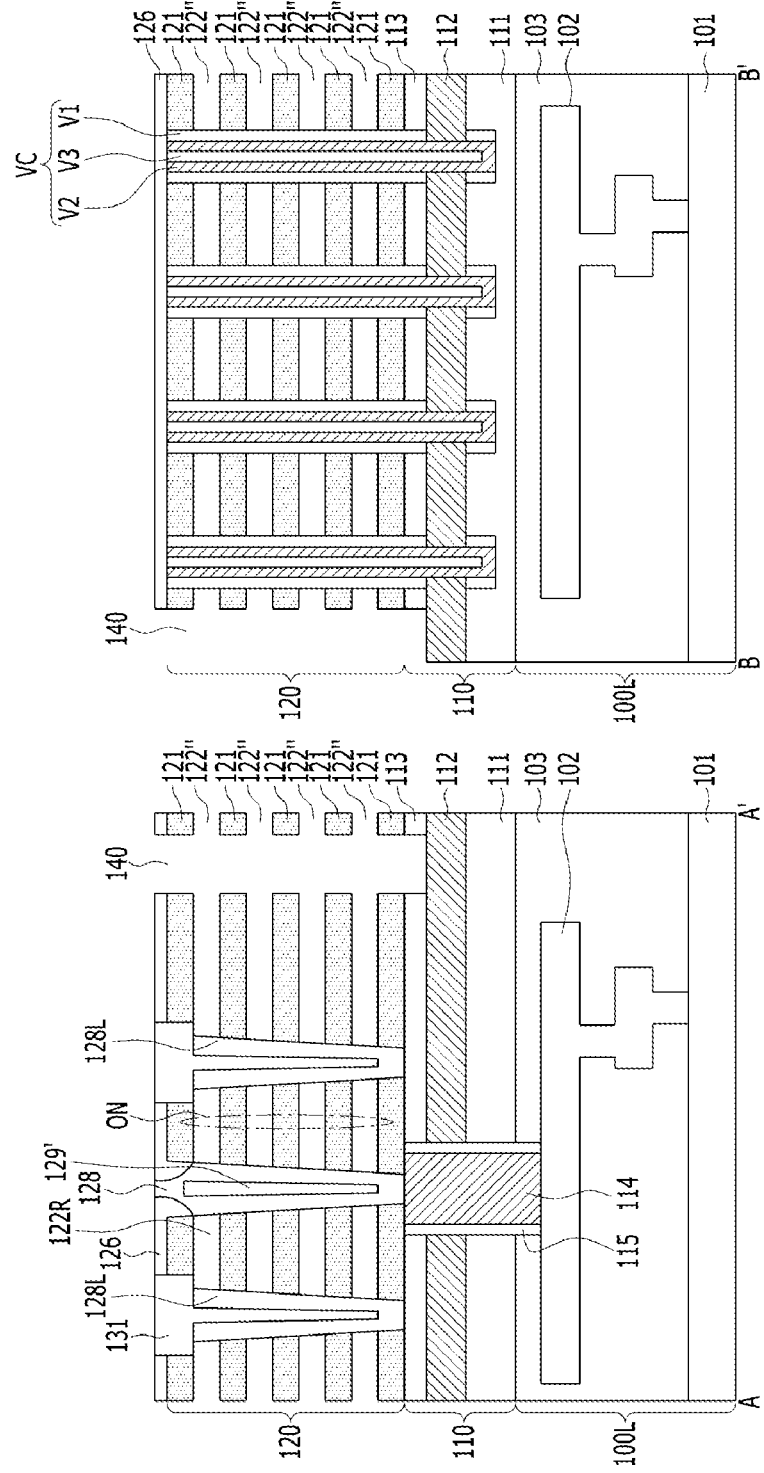

Referring to FIG. 17, the sacrificial layers 122' of the upper structure 120 may be selectively removed. Accordingly, lateral recesses 122" may be formed between the dielectric layers 121. The lateral recesses 122" may be referred to as lateral air gaps. The lateral recesses 122" and the dielectric layers 121 may be alternately stacked. When the sacrificial layer 122' includes silicon nitride, the sacrificial layer 122' may be removed by a chemical including phosphoric acid ($H_3PO_4$). The lateral recesses 122" may be formed in the cell array region, and the first alternating stack ON may remain in the contact region. In the first alternating stack ON, dielectric layers 121 and sacrificial layers 122' may be alternately stacked. A portion of the sacrificial layers 122' might not be removed due to the presence of the supporters 131 during the etching process for forming the lateral recesses 122". The remaining portion of the sacrificial layers 122' may be abbreviated as the gate-level dielectric layer 122R. The gate-level dielectric layers 122R may remain between the supporters 131, and the gate-level dielectric layers 122R and the dielectric layers 121 may form the first alternating stack ON. When the gate-level dielectric layers 122R include silicon nitride and the dielectric layers 121 include silicon oxide, the first alternating stack ON may be an alternating stack in which silicon oxides and silicon nitrides are alternately stacked, and the first alternating stack ON may be positioned between the line-type supporters 131.

Figure 18:
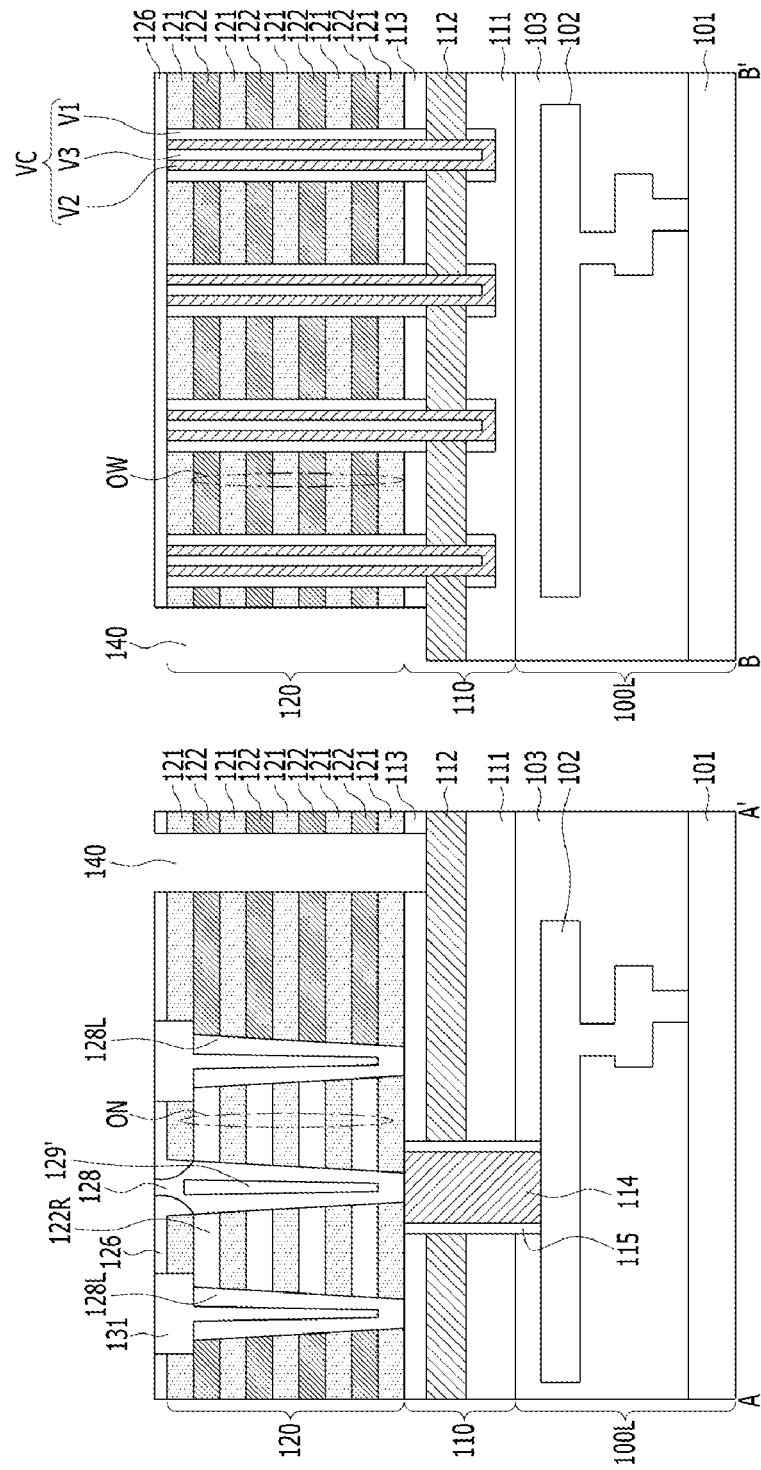

Referring to FIG. 18, gate electrodes 122 may be formed. The gate electrodes 122 may respectively fill the lateral recesses 122". The dielectric layers 121 and the gate electrodes 122 may form a second alternating stack OW. The alternating stack OW may be stacked by alternating the dielectric layers 121 and the gate electrodes 122. A portion of the second alternating stack OW which is adjacent to the first alternating stack ON may be supported by the supporters 131.

The gate electrodes 122 may include a low resistance material. The gate electrodes 122 may be formed of a metal-based material. The gate electrodes 122 may include metal, metal silicide, metal nitride, or a combination thereof. For example, the metal may include nickel, cobalt, platinum, titanium, tantalum, or tungsten. The metal silicide may include nickel silicide, cobalt silicide, platinum silicide, titanium silicide, tantalum silicide, or tungsten silicide. The gate electrodes 122 may include a stack of titanium nitride and tungsten.

Referring to FIGS. 17 and 18, the sacrificial layers 122" may be replaced with the gate electrodes 122.

Figure 19:
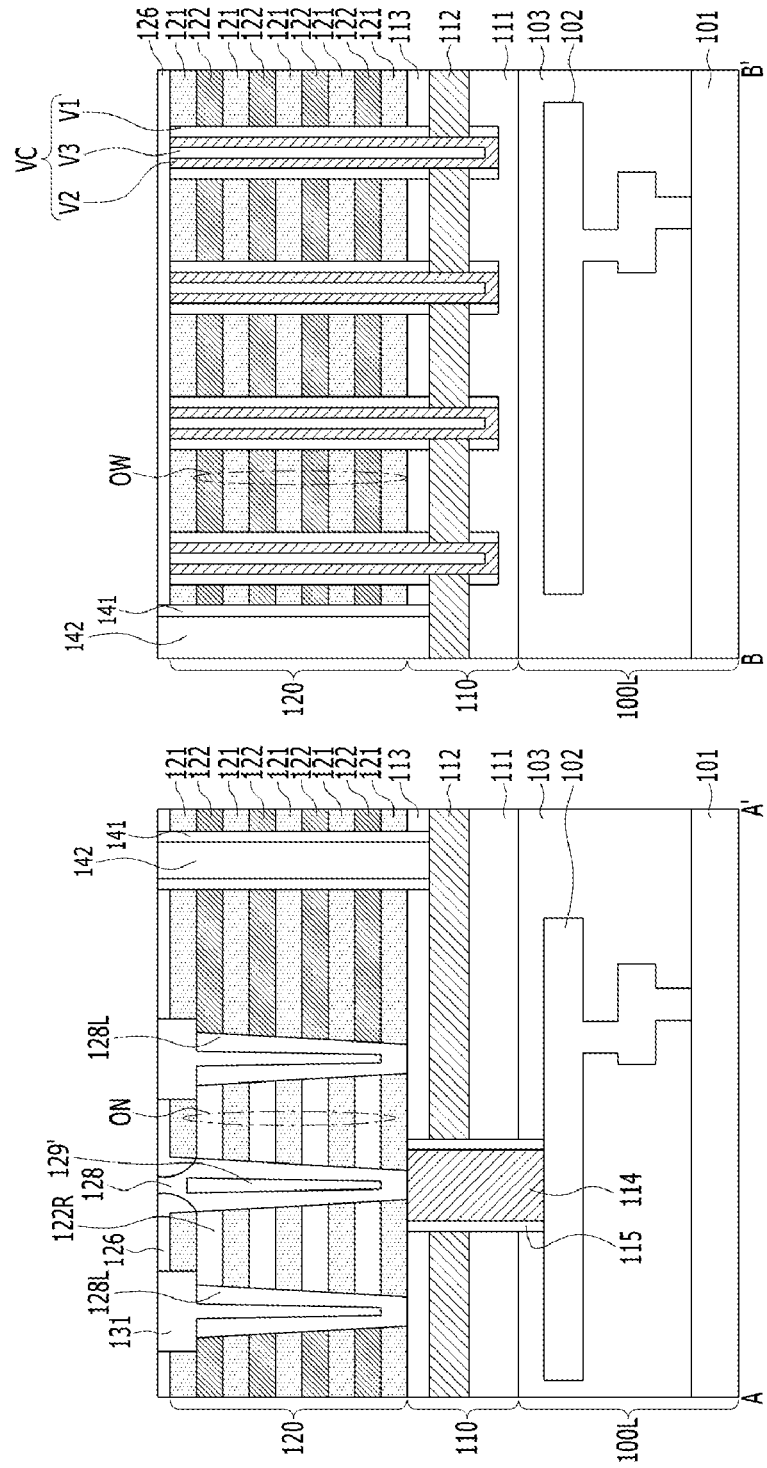

Referring to FIG. 19, the sidewall of the vertical slit 140 may be sealed. The sidewall of the vertical slit 140 may be sealed by the sealing layer 141. The sealing layer 141 may seal the ends of the gate electrodes 122. The sealing layer 141 may seal the side surfaces of the dielectric layers 121. The sealing layer 141 may seal the side surface of the source conductive layer 113. The sealing layer 141 may include a silicon oxide-based material. The sealing layer 141 may include a low-k constant material. According to another embodiment, the sealing layer 141 may include a material having resistance to wet etching from the subsequent processes. The sealing layer 141 may include SiCN, SiBCN, SiBN, or a combination thereof.

Subsequently, a source contact plug 142 may be formed in the vertical slit 140. The source contact plug 142 may fill the vertical slit 140. The source contact plug 142 may include a stack of a silicon-containing material and a metal-containing material, and the source contact plug 142 may further include a barrier material between the silicon-containing material and the metal-containing material. The silicon-containing material may include polysilicon, and the metal-containing material may include tungsten. The barrier material may include titanium nitride. According to another embodiment, the source contact plug 142 may be formed of tungsten alone or polysilicon alone.

Figure 20:
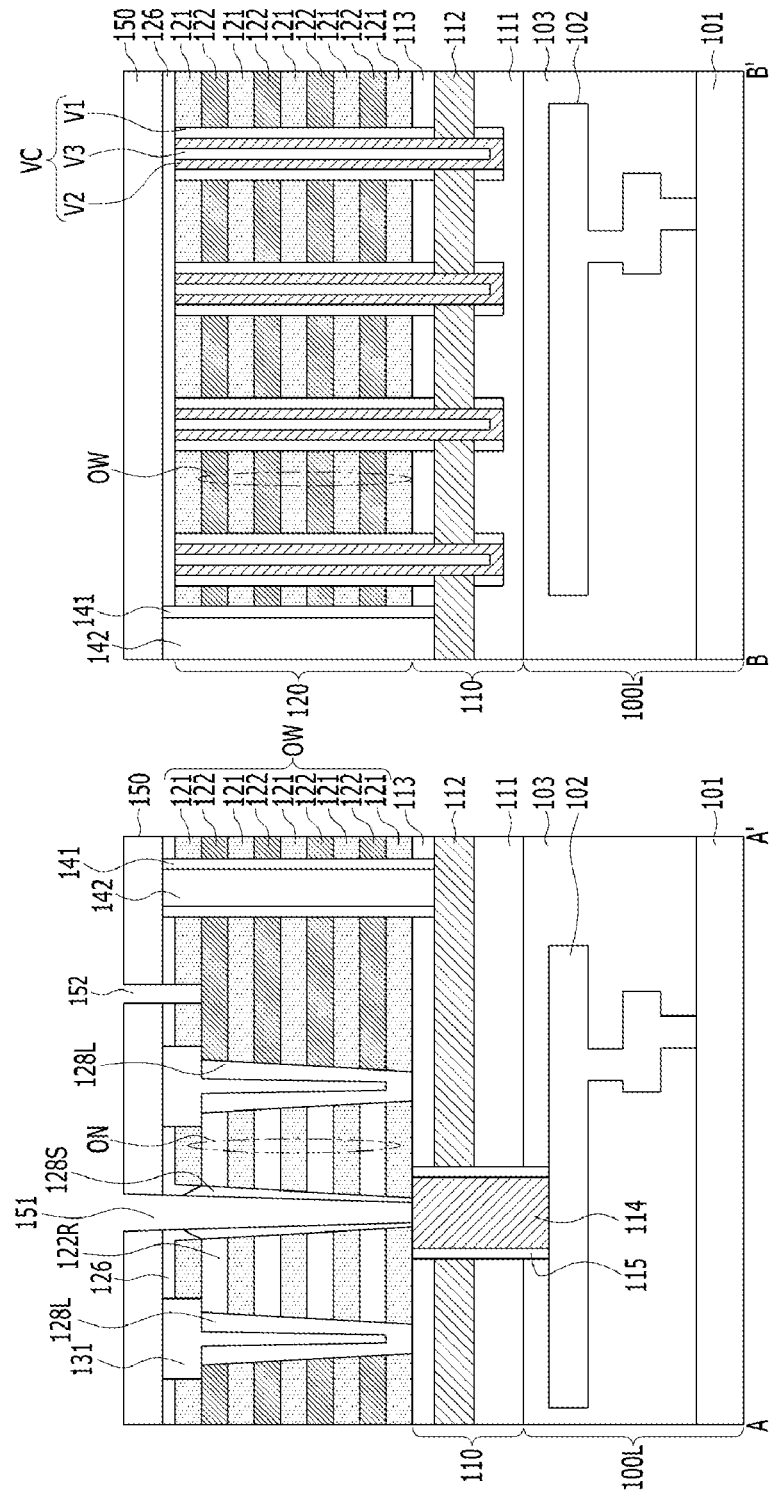

Referring to FIG. 20, an inter-layer dielectric layer 150 may be formed. A contact hole 151 may be formed by etching the inter-layer dielectric layer 150 to expose a portion of the first upper level opening 123, and continuously etching a portion of the void-embedded sacrificial plug 126/128/129'. A conformal sidewall liner 128S may remain on the sidewall of the contact hole 151 by the partial etching of the conformal layer 128, and the closed void 129' may be removed. The upper end of the conformal sidewall liner 128S may be covered by the non-conformal layer 126.

The contact hole 151 may expose the upper surface of the first contact plug 114.

While the contact hole 151 is formed, a pad contact hole 152 may be formed at the same time. The pad contact hole 152 may expose edge portions of the gate electrodes 122.

As described above, in this embodiment, a merge process capable of simultaneously forming the contact hole 151 and the pad contact hole 152 may be applied. During the etching process for the contact hole 151, the closed void 129' may serve to control the contact-not-open phenomenon. In other words, contact-not-open may be prevented by the closed void 129'.

As a comparative example, the void-embedded sacrificial plug 126/128/129' might not include the void 129' and the non-conformal layer 126, and in this case, the sacrificial plug may be formed of an oxide conformal layer 128 alone. Accordingly, all of the conformal layer 128 may be etched during the etching process for the contact hole 151. However, in the comparative example, the etching process may be performed with a tilt while the conformal layer 128 is etched, and thus the contact hole 151 is not opened due to the tilt etching, which is the contact-not-open phenomenon.

Figure 21:
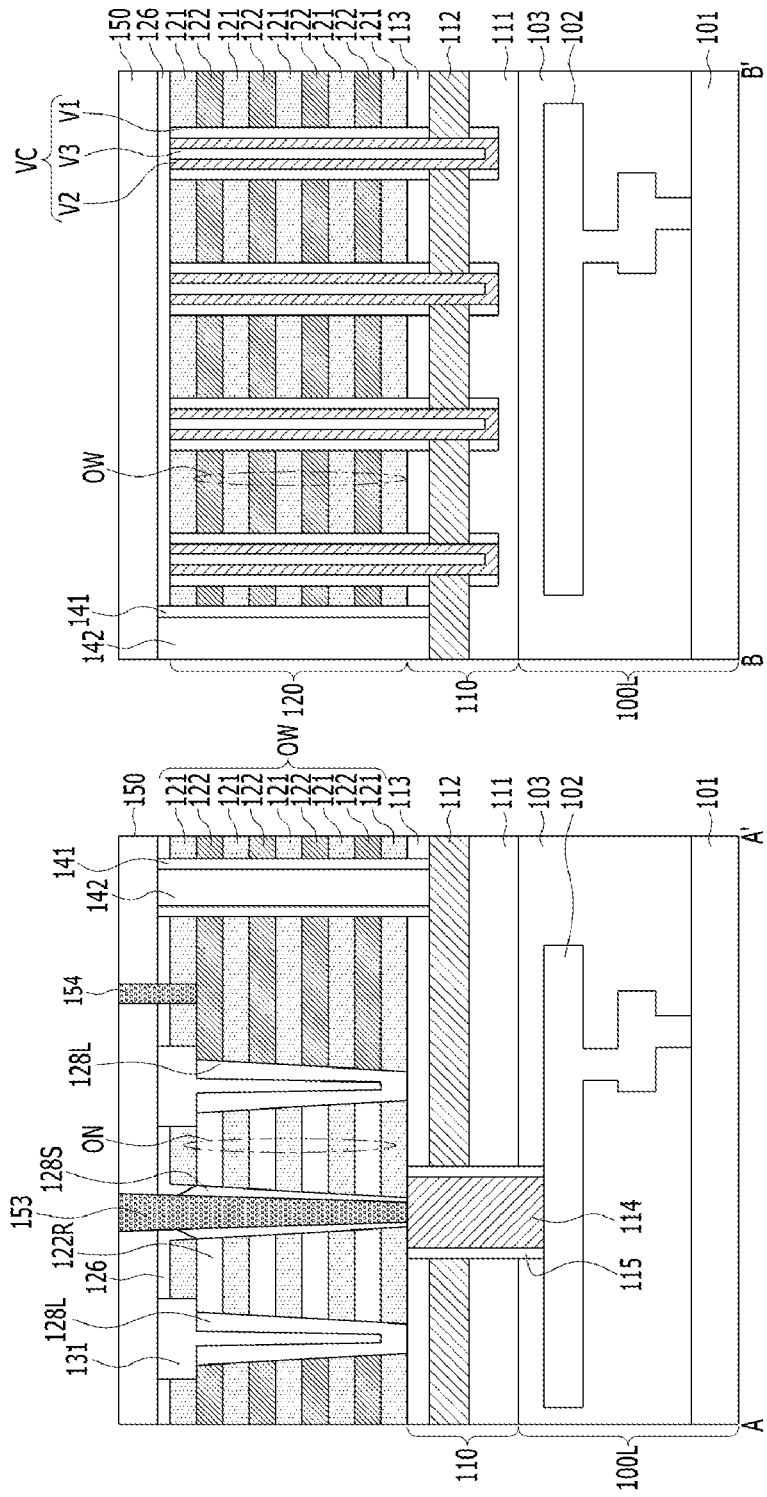

Referring to FIG. 21, a second contact plug 153 filling the contact hole 151 may be formed. The second contact plug 153 may include a metal-based material. The second contact plug 153 may include tungsten. For example, in order to form the second contact plug 153, a tungsten layer may be deposited to fill the contact hole 151 and then planarization such as Chemical Mechanical Polishing (CMP) may be performed. While the second contact plug 153 is formed, a gate contact plug 154 may be formed at the same time. The gate contact plug 154 may be coupled to the gate electrode 122.

As described above, this embodiment may include forming the void-embedded sacrificial plug 128/129'/126 over the first contact plug 114, forming the contact hole 151 to remove the void 129' while etching a portion of the void-embedded sacrificial plug 126/128/129', and forming the second contact plug 153 in the contact hole 151. The void 129' of the void-embedded sacrificial plug 126/128/129' may be replaced with the second contact plug 153.

According to the embodiment, the process may be simplified because a contact hole and a pad contact hole are formed at the same time.

According to the embodiment, since voids are used in an etching process for forming a contact hole, contact-not-open may be prevented.

According to the embodiment, structural stability may be improved by forming a void-free supporter.

While the present teachings have been described with respect to specific embodiments, it will be apparent to those skilled in the art that various changes and modifications may be made to these embodiments without departing from the spirit and scope of the present teachings as defined in the following claims.

What is claimed is:

1. A method for fabricating a semiconductor device, comprising:
   forming a lower structure including an interconnection;
   forming a first contact plug coupled to the interconnection;
   forming an alternating stack of dielectric layers and sacrificial layers over the first contact plug and the lower structure;
   forming an opening that penetrates the alternating stack and exposes the first contact plug;
   forming a sacrificial plug including a void in the opening;
   forming a contact hole that exposes the first contact plug by etching a portion of the sacrificial plug; and
   forming a second contact plug in the contact hole,
   wherein forming the sacrificial plug including the void in the opening includes:
      forming a non-conformal layer that covers a top corner of the opening; and
      forming a conformal layer that fills the opening over the non-conformal layer, wherein the conformal layer is formed with a void which is positioned inside the opening.

2. The method of claim 1,
   wherein a material forming the conformal layer has increased step coverage over a material forming the non-conformal layer.

3. The method of claim 1,
   wherein the non-conformal layer includes a first oxide and the conformal layer includes a second oxide, wherein the second oxide has increased step coverage over the first oxide.

4. The method of claim 1,
   wherein the non-conformal layer includes plasma enhanced tetraethylorthosilicate (PETEOS).

5. A method for fabricating a semiconductor device, comprising:
   forming a source structure including a first contact plug over a lower structure including an interconnection, wherein the first contact plug is coupled to the interconnection;
   forming an alternating stack of dielectric layers and sacrificial layers over the first contact plug and the source structure;
   forming a vertical channel structure that penetrates a portion of the alternating stack;
   forming a void-embedded sacrificial plug that is spaced apart from the vertical channel structure, penetrates the alternating stack, and is coupled to the first contact plug;
   replacing a portion of the sacrificial layers with gate electrodes to surround the vertical channel structure;
   forming a contact hole that exposes the first contact plug by etching a portion of the void-embedded sacrificial plug;
   forming a pad contact hole that exposes an edge of one of the gate electrodes;
   forming a contact plug in the contact hole; and
   forming a gate contact plug in the pad contact hole,
   wherein forming the void-embedded sacrificial plug includes:

forming an opening that is spaced apart from the vertical channel structure, penetrates the alternating stack, and exposes the first contact plug;

forming a non-conformal layer that covers a top corner of the opening; and forming a conformal layer that fills the opening over the non-conformal layer, wherein the conformal layer is formed with a void which is positioned inside the opening.

6. The method of claim 5,
wherein a material forming the conformal layer has increased step coverage over a material forming the non-conformal layer.

7. The method of claim 5,
wherein the non-conformal layer includes a first oxide and the conformal layer includes a second oxide, wherein the second oxide has increased step coverage over the first oxide.

8. The method of claim 5,
wherein the non-conformal layer includes plasma enhanced tetraethylorthosilicate (PETEOS).

9. A method for fabricating a semiconductor device, comprising:

forming a source structure including a first contact plug over a lower structure including an interconnection, wherein the first contact plug is coupled to the interconnection;

forming an alternating stack of dielectric layers and sacrificial layers over the first contact plug and the source structure;

forming a vertical channel structure that penetrates the alternating stack;

forming a hole-type opening that exposes the first contact plug and line-type openings that are disposed adjacent to the hole-type opening, the hole-type opening and the line-type openings being spaced apart from the vertical channel structure and penetrating the alternating stack;

forming a void-embedded sacrificial plug in the hole-type opening;

filling the line-type openings with void-free supporters;

replacing a portion of the sacrificial layers with gate electrodes to surround the vertical channel structure;

forming a contact hole that exposes the first contact plug by etching a portion of the void-embedded sacrificial plug;

forming a pad contact hole that exposes an edge of one of the gate electrodes;

forming a contact plug in the contact hole; and forming a gate contact plug in the pad contact hole, wherein forming the void-embedded sacrificial plug in the hole-type opening includes:

forming a non-conformal layer that covers a top corner of the hole-type opening; and forming a conformal layer that fills the hole-type opening over the non-conformal layer, wherein the conformal layer is formed with a void which is positioned inside the hole-type opening.

10. The method of claim 9,
wherein a material forming the conformal layer has increased step coverage over a material forming the non-conformal layer.

11. The method of claim 9,
wherein the non-conformal layer includes a first oxide and the conformal layer includes a second oxide, wherein the second oxide has increased step coverage over the first oxide.

12. The method of claim 9,
wherein the non-conformal layer includes plasma enhanced tetraethylorthosilicate (PETEOS).

13. The method of claim 9,
wherein edges of the gate electrodes are formed in a stepped structure.

14. The method of claim 13, further comprising:
forming a plurality of pillar-type supporters that penetrate the stepped structure.

15. A method, for fabricating a semiconductor device, comprising:

forming a source structure including a first contact plug over a lower structure including an interconnection, wherein the first contact plug is coupled to the interconnection;

forming an alternating stack of dielectric layers and sacrificial layers over the first contact plug and the source structure;

forming a vertical channel structure that penetrates the alternating stack;

forming a hole-type opening that exposes the first contact plug and line-type openings that are disposed adjacent to the hole-type opening, the hole-type opening and the line-type openings being spaced apart from the vertical channel structure and penetrating the alternating stack;

forming a void-embedded sacrificial plug in the hole-type opening;

filling the line-type openings with void-free supporters;

replacing a portion of the sacrificial layers with gate electrodes to surround the vertical channel structure;

forming a contact hole that exposes the first contact plug by etching a portion of the void-embedded sacrificial plug;

forming a pad contact hole that exposes an edge of one of the gate electrodes;

forming a contact plug in the contact hole; and forming a gate contact plug in the pad contact hole, wherein forming the void-embedded sacrificial plug in the hole-type opening and filling the line-type openings with the void-free supporters includes:

forming a non-conformal layer that covers a top corner of the hole-type opening and top corners of the line-type openings;

forming a conformal layer that fills the hole-type opening and the line-type openings over the non-conformal layer and includes voids;

removing the non-conformal layer and the conformal layer from the top corners of the line-type openings to expose the voids of the line-type openings; and filling the exposed voids of the line-type openings with a supporter material.

16. The method of claim 15, wherein each of the non-conformal layer and the conformal layer includes silicon oxide, and the non-conformal layer includes plasma enhanced tetraethylorthosilicate (PETEOS), and the conformal layer includes silicon oxide that is formed by an Atomic Layer Deposition (ALD) process.

* * * * *